US 12,444,660 B2

(12) United States Patent
Liao et al.

(10) Patent No.: US 12,444,660 B2
(45) Date of Patent: Oct. 14, 2025

(54) TEST STRUCTURE FOR VOID AND TOPOGRAPHY MONITORING IN A FLASH MEMORY DEVICE

(71) Applicant: Taiwan Semiconductor Manufacturing Company, Ltd., Hsinchu (TW)

(72) Inventors: Ken-Ying Liao, Tainan (TW); Chih-Wei Sung, Kaohsiung (TW); Tzu-Pin Lin, Tainan (TW); Huai-jen Tung, Tainan (TW); Po-Zen Chen, Tainan (TW); Yen-Jou Wu, Tainan (TW); Yung-Lung Yang, Chiayi (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 712 days.

(21) Appl. No.: 17/446,585

(22) Filed: Aug. 31, 2021

(65) Prior Publication Data
US 2023/0062401 A1   Mar. 2, 2023

(51) Int. Cl.
*H01L 21/66*   (2006.01)
*H10B 41/30*   (2023.01)
*H10B 41/40*   (2023.01)

(52) U.S. Cl.
CPC ............. *H01L 22/34* (2013.01); *H10B 41/30* (2023.02); *H10B 41/40* (2023.02)

(58) Field of Classification Search
CPC ......... H01L 22/12; H01L 22/34; H10B 41/30; H10B 41/35
See application file for complete search history.

(56) References Cited

U.S. PATENT DOCUMENTS

| | | | |
|---|---|---|---|
| 5,275,963 A * | 1/1994 | Cederbaum | H01L 21/76897 438/626 |
| 6,232,180 B1 | 5/2001 | Chen | |
| 9,437,603 B2 | 9/2016 | Hsieh et al. | |
| 9,484,352 B2 | 11/2016 | Chuang et al. | |
| 2015/0137206 A1* | 5/2015 | Liu | H10D 30/696 438/266 |
| 2019/0393234 A1* | 12/2019 | Lin | H01L 21/76802 |

* cited by examiner

*Primary Examiner* — Amar Movva
(74) *Attorney, Agent, or Firm* — Harrity & Harrity, LLP

(57) ABSTRACT

A semiconductor device includes a memory region including an array of memory cell devices, and a test region including a test memory cell structure. The test memory cell structure includes a first gate stack on a first raised portion of a substrate, a first polysilicon structure adjacent to the first raised portion and in a region between the first raised portion and a second raised portion of the substrate, a first spacer adjacent to the first polysilicon structure, and a second gate stack on the second raised portion, a second polysilicon structure adjacent to the second raised portion and in the region between the first raised portion and the second raised portion, and a second spacer adjacent to the second polysilicon structure. The semiconductor device includes an interlayer dielectric layer over at least a portion of the memory region and at least a portion of the test region.

20 Claims, 24 Drawing Sheets

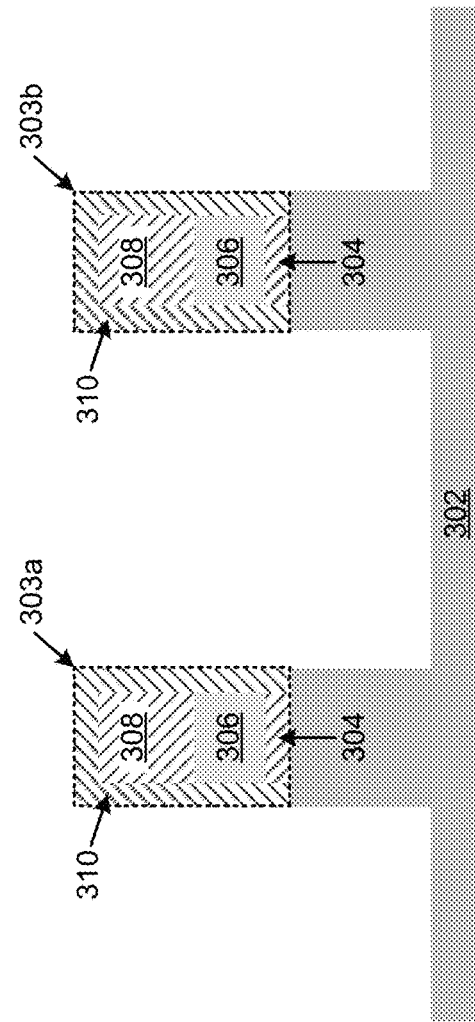

TEST STRUCTURE FOR VOID AND TOPOGRAPHY MONITORING IN A FLASH MEMORY DEVICE

BACKGROUND

A flash memory device is an electronic non-volatile computer storage medium that can be electrically programmed, read, and erased. To store information, a flash memory device includes an addressable array of flash memory cell devices, typically formed from floating gate transistors. Common types of flash memory cell devices include split-gate flash memory cell devices and stacked-gate flash memory cell devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
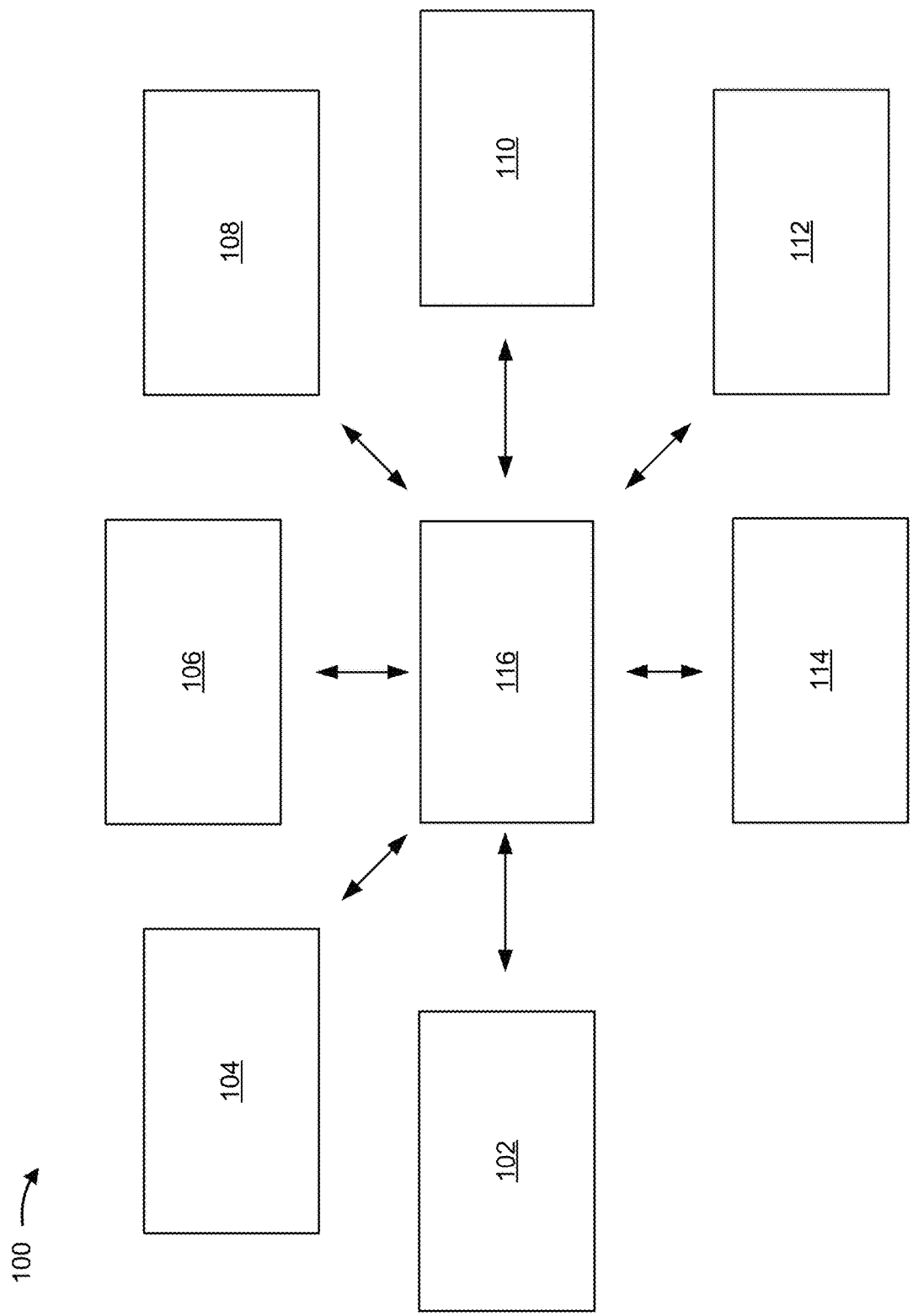
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An array of memory cell devices, such as an array of split-gate flash memory cell devices, are formed in a memory region of a semiconductor substrate, and logic devices (e.g., devices supporting operation of the array of split-gate flash memory cell devices) are formed within a (separate) logic region of the semiconductor substrate. Generally, contacts to the split-gate flash memory cell devices extend through an interlayer dielectric (ILD) layer that is formed over the memory region and the logic region.

In an array of memory cell devices (e.g., an array of split-gate flash memory cell devices), there is a region between a given pair of adjacent memory cell devices (e.g., between spacers on the word line polysilicon structures of the given pair of adjacent memory cell devices). However, as dimensions of memory cell devices are reduced, the width of this region is reduced, meaning that an aspect ratio (e.g., a height-to-width ratio) of the region increases. The reduced width (i.e., increased aspect ratio) of the region negatively impacts gap filling performance of the ILD layer in the region, meaning that voids can be present in the ILD layer in the region when the ILD layer is formed over the memory region. Thus, the aspect ratio of the region will determine whether a void will be formed during subsequent semiconductor processing operations. Notably, a void in the ILD layer within the region can adversely impact formation of a contact that is later formed through the region (e.g., after etching of the ILD layer). The presence of voids reduces wafer yield and increases wafer scrapping.

Further, a thickness of a backside anti-reflective coating (BARC) layer deposited during formation of the memory cell devices affects the width of the region between a given pair of adjacent memory cell devices. Typically, deposition of a BARC layer uses a spin-on coating process. However, spin-on coating of the BARC layer used during fabrication of arrays of memory cell devices can result in a thickness of the BARC layer being non-uniform among the memory cell devices due to topography of the memory cell devices. For example, the topography of the memory cell devices may cause a thickness of the BARC layer nearer to a center of a wafer to be greater than a thickness of the BARC layer nearer to an edge of the wafer. A result of the varying thicknesses of the BARC layer impacts etching of polysilicon layers of the memory cell devices that are used to form word line structures and therefore means that widths of regions between memory cell devices can vary among the memory cell devices. A given semiconductor device on a wafer includes a number (e.g., thousands or millions) of memory cell structures, meaning that monitoring memory cell topography sizes and/or voids is impractical or impossible.

Some implementations described herein provide techniques and apparatuses for a test memory cell structure for void and topography monitoring in a flash memory device. In some implementations, a semiconductor device may include a memory region including an array of memory cell devices, and a test region including a test memory cell structure. In some implementations, the test memory cell structure includes a first gate stack on a first raised portion of a substrate, a first polysilicon structure adjacent to the first raised portion and in a region between the first raised portion and a second raised portion of the substrate, and a first spacer adjacent to the first polysilicon structure in the region between the first raised portion and the second raised portion. The test memory cell structure may further include a second gate stack on the second raised portion, a second polysilicon structure adjacent to the second raised portion and in the region between the first raised portion and the second raised portion, and a second spacer adjacent to the second polysilicon structure in the region between the first raised portion and the second raised portion. The test memory cell structure may further include an ILD layer over at least a portion of the memory region and at least a portion of the test region.

In some implementations, the test memory cell structure described herein enables void and topography monitoring of the array of memory cell devices of the semiconductor device. For example, in some implementations, the test memory cell structure is formed so that an aspect ratio of a region between gate stacks of the test memory cell structure is configured to match or be greater than a "worst case" aspect ratio among regions between gate stacks of the memory cell devices in the array. The region formed in the test memory cell structure may, therefore, be used for void and topography monitoring to, for example, determine performance of a BARC layer deposition and/or whether regions between memory cell devices are formed according to specification (e.g., such that ILD gap filling performance is acceptable). That is, the test memory cell structure can be monitored to determine whether one or more structures or layers are properly formed in memory cell devices and/or whether voids are present in regions between memory cell devices of the semiconductor device (e.g., without a need to monitor the memory cell devices themselves). In some implementations, the test memory cell structure may be used to increase yield. Additionally, the void and topography monitoring enabled by the test memory cell structure may improve cycle times associated with fabricating the semiconductor device (e.g., by reducing an amount of time used to perform over-etching and an amount of time used to perform void and topography monitoring).

FIG. 1 is a diagram of an example environment 100 in which systems and/or methods described herein may be implemented. The example environment 100 includes semiconductor processing tools that can be used to form semiconductor devices and structures, such as a semiconductor devices and test memory cell structures described herein.

As shown in FIG. 1, environment 100 may include a plurality of semiconductor processing tools 102-114 and a wafer/die handling device 116. The plurality of semiconductor processing tools 102-114 may include a deposition tool 102, an exposure tool 104, a developer tool 106, an etch tool 108, a removal tool 110, a planarization tool 112, an implantation tool 114, and/or another type of semiconductor processing tool. The tools included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer, an anti-reflective coating, or another type of layer on a substrate such as a wafer. In some implementations, the deposition tool 102 may deposit a metal material to form one or more conductors or conductive layers, may deposit an insulating material to form a dielectric or insulating layer, and/or the like as described herein. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light source, and/or the like), an x-ray source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotopically or directionally etch the one or more portions.

The removal tool 110 is a semiconductor processing tool that is capable of removing a portion of a layer deposited on a substrate, such as a photoresist layer, an anti-reflective coating, or the like. For example, the removal tool 110 may remove one or more portions of a photoresist layer (e.g., using a chemical stripper and/or another technique) after the etch tool 108 uses the photoresist layer to etch the substrate.

The planarization tool 112 is a semiconductor processing tool that is capable of polishing or planarizing various layers of a wafer or semiconductor device. For example, a polishing device may include a chemical mechanical polishing (CMP) device and/or another type of polishing device. In some implementations, the polishing device may polish or planarize a layer of deposited or plated material. A CMP process may include depositing a slurry (or polishing compound) onto a polishing pad. A wafer may be mounted to a carrier, which may rotate the wafer as the wafer is pressed against the polishing pad. The slurry and polishing pad act as an abrasive that polishes or planarizes one or more layers of the wafer as the is rotated. The polishing pad may also be rotated to ensure a continuous supply of slurry is applied to the polishing pad.

The implantation tool 114 is a semiconductor processing tool that is capable of implanting ions into a substrate of a semiconductor wafer. In some implementations, the implantation tool 114 generates ions in an arc chamber from a source material such as a gas or a solid. The source material is provided into the arc chamber, and an arc voltage is discharged between a cathode and an electrode to produce a plasma containing ions of the source material. One or more extraction electrodes are used to extract the ions from the plasma in the arc chamber and accelerate the ions to form an ion beam.

Wafer/die handling device 116 includes a mobile robot, a robot arm, a tram or rail car, and/or another type of device that are used to handle wafers and/or dies and/or transport wafers and/or dies between semiconductor processing tools 102-114 and/or to and from other locations such as a wafer rack, a storage room, and/or the like. In some implementations, wafer/die handling device 116 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
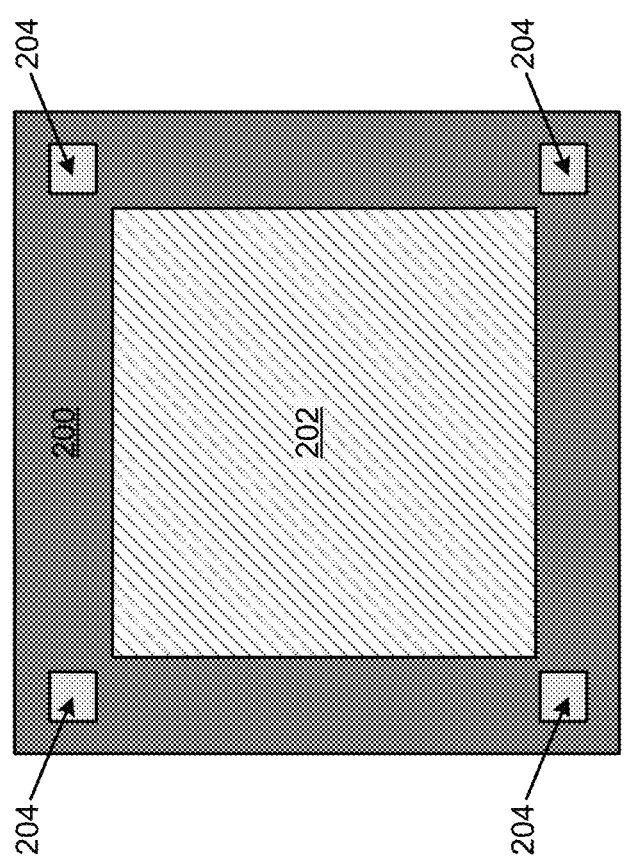
FIG. 2 is a diagram of an example semiconductor device described herein.

FIG. 2 is a diagram of an example semiconductor device 200 described herein. The semiconductor device 200 includes an example of a semiconductor device that includes a test memory cell structure that enables void and topography monitoring, as described herein.

As shown in FIG. 2, the semiconductor device 200 includes memory region 202 and one or more of test regions 204. In some implementations, the semiconductor device 200 is one of a plurality of semiconductor devices 200 on a wafer (not shown). The memory region 202 is a region of the semiconductor device 200 in which an array of memory cell devices (e.g., an array of split-gate flash memory cells) are formed. A test region 204 is a region of the semiconductor device 200 in which one or more test memory cell structures (e.g., test memory cell structures 300, described below with respect to FIG. 3) are formed. In some implementations, the test regions 204 are outside of a shallow trench isolation (STI) region of the semiconductor device 200. That is the one or more test regions 204 are arranged outside of a region of the semiconductor device 200 in which one or more STI structures are formed.

In some implementations, the semiconductor device 200 includes a plurality of test regions 204, each including one or more test memory cell structures (e.g., an array of test memory cell structures). In some implementations, the test regions 204 are arranged around the memory region 202. For example, as shown in FIG. 2, the test regions 204 may, in some implementations, be arranged in different corners or edges of the semiconductor device 200. Arrangement of the test regions 204 around the memory region 202 (e.g., at different corners or edges of the semiconductor device 200) enables void and topography monitoring irrespective of a location of the semiconductor device 200 on the wafer. That is, the arrangement of the test regions 204 around the memory region 202 ensures that the most significant deviation in BARC deposition thickness present in the semiconductor device 200 (due to the spin-coating of the BARC layer) occurs in a test region 204 of the semiconductor device 200 (e.g., such that a thickness of the BARC layer in an area of the semiconductor device 200 will be greatest in one of the test regions 204). This means that a region of the semiconductor device 200 that is most significantly impacted by variation in thickness of the BARC layer will be present in a test memory cell structure of one of the test regions 204.

As indicated above, FIG. 2 is provided as an example. Other examples may differ from what is described with regard to FIG. 2. The number and arrangement of memory region 202 and test regions 204 shown in FIG. 2 are provided as an example. In practice, there may be additional memory region 202 and/or test regions 204, fewer memory region 202 and/or test regions 204, or differently arranged memory region 202 and/or test regions 204 than those shown in FIG. 2.

Figure 3:
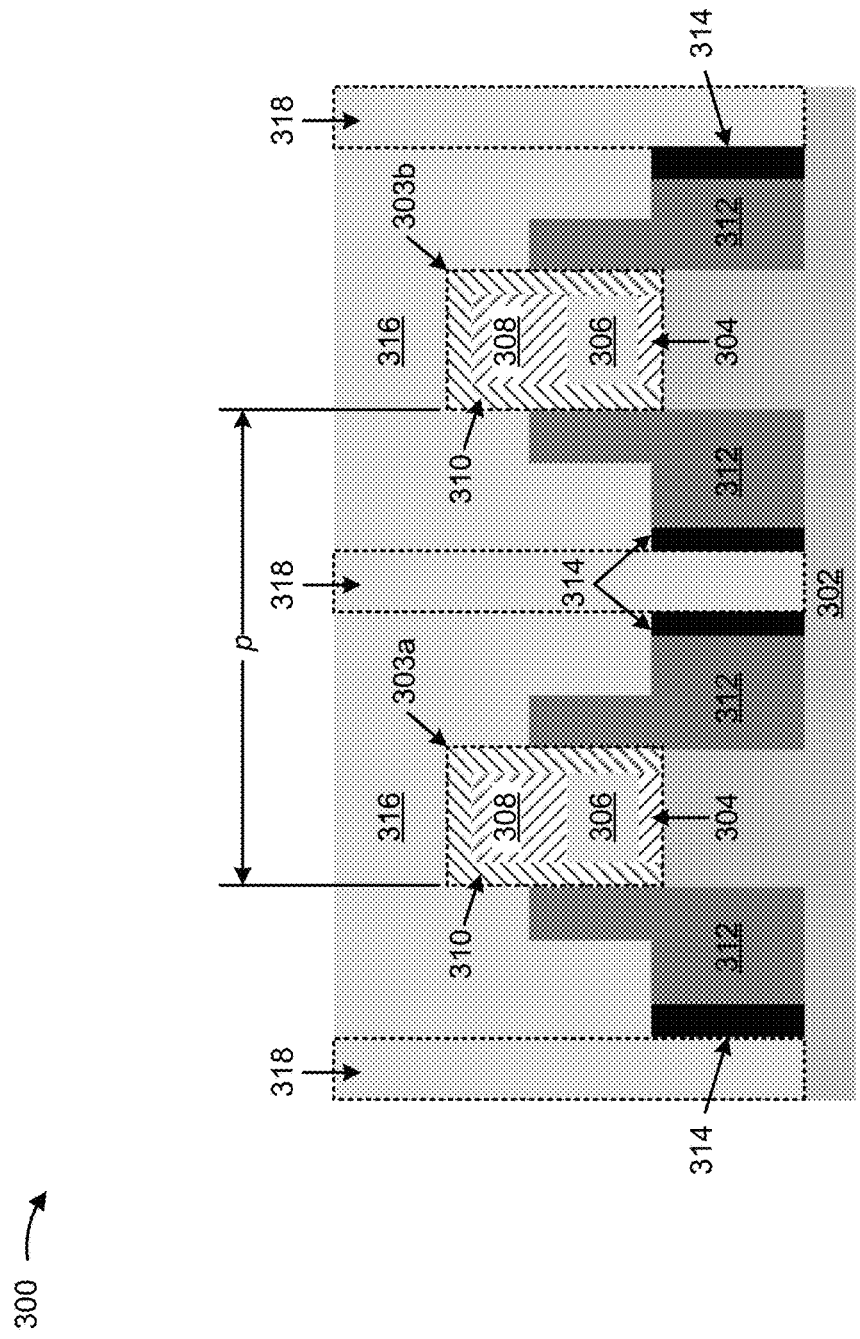
FIG. 3 is a diagram of an example semiconductor structure described herein.

FIG. 3 is a diagram of an example test memory cell structure 300 described herein. The test memory cell structure 300 includes an example of a test memory cell structure that enables void and topography monitoring, as described herein.

As shown in FIG. 3, the test memory cell structure 300 (more generally referred to as a test structure) includes a substrate 302 and a pair of gate stacks 303 (e.g., gate stack 303a, gate stack 303b) arranged on raised portions of the substrate 302. As shown, each gate stack 303 includes a dielectric region 304, a polysilicon region 306, a mask region 308, and dielectric liners 310. As further shown, the test memory cell structure 300 further includes polysilicon structures 312 adjacent to the raised portions of the substrate 302 and the gate stacks 303 (e.g., in a recess of the substrate 302), and spacers 314 adjacent to the polysilicon structures 312. As further shown, the test memory cell structure 300 includes an ILD layer 316 over the gate stacks 303, the polysilicon structures 312, the spacers 314, and the substrate 302 between the spacers 314.

The substrate 302 is a semiconductor die substrate, a semiconductor wafer, or another type of substrate in which one or more semiconductor devices, such as an array of split gate flash memory cell devices, a stacked gate flash memory cell device, or the like, may be formed. In some implementations, the substrate 302 is formed of silicon, a material including silicon, a III-V compound semiconductor material such as gallium arsenide (GaAs), a silicon on insulator (SOI), or another type of semiconductor material.

As noted above, a gate stack 303 (more generally referred to as a layer stack) includes a dielectric region 304, a polysilicon region 306, a mask region 308, and dielectric liners 310. The dielectric region 304 and the polysilicon region 306 are arranged over the raised portion of the substrate 302, with the dielectric region 304 interposed between the raised portion of the substrate 302 and the polysilicon region 306. The dielectric region 304 may be, for example, an oxide-nitride-oxide (ONO) film, such as a silicon oxide-silicon nitride-silicon oxide, another type of multi-layer film, or another type of dielectric material. The polysilicon region 306 may be, for example, doped polysilicon or another type of conductive material. The mask region 308 may be arranged over the polysilicon region 306 and may be formed from, for example, a nitride-oxidenitride (NON) film, such as a silicon nitride-silicon oxide-silicon nitride, another type of multi-layer film, or another type of dielectric material.

As shown, the dielectric liners 310 corresponding to the gate stack 303 extend from the raised portion of the substrate 302 to line the dielectric region 304, the polysilicon region 306, and the mask region 308. For example, the dielectric liners 310 line sidewalls of the dielectric region 304, the polysilicon region 306, and the mask region 308. In some implementations, as shown, the dielectric liners 310 may line a top surface of the mask region 308. In some implementations, the dielectric liners 310 are, for example, ONO films or another type of dielectric material.

As further shown, polysilicon structures 312 corresponding to the gate stacks 303 are arranged adjacent to the corresponding gate stacks 303. Each gate stack 303 is associated with a corresponding pair of polysilicon structures 312 (e.g., each gate stack 303 is between a corresponding pair of adjacent polysilicon structures 312), as illustrated in FIG. 3. Notably, as shown in FIG. 3, the polysilicon structures 312 are arranged in a region between the raised portions of the substrate 302 in the test memory cell structure 300. The polysilicon structures 312 may be formed from, for example, doped polysilicon or another type of conductive material. As further shown, spacers 314 are arranged along sidewalls of the polysilicon structures 312. The spacers 314 may be formed from, for example, silicon dioxide, silicon nitride, or another type of dielectric material. In some implementations, the polysilicon structures 312 and the spacers 314 are formed on sides of the gate stacks 303 in the region between the raised portions of the substrate 302 and not on opposing sides of the gate stacks 303.

The ILD layer 316 is a film, layer, or material that provides electrical isolation between metal layers, conductive layers, or adjacent semiconductor devices. The ILD layer 316 may include a low dielectric constant (low-k) material, such as a material having a dielectric constant of 3.9 or less. Examples of materials that may be used for an ILD layer include silicon dioxide, fluorine-doped silicon dioxide (also referred to as fluorinated silica glass or fluorosilicate glass), or carbon-doped silicon dioxide (also referred to as organosilicate glass).

In some implementations, a pitch p between the gate stack 303a and the gate stack 303b may define an aspect ratio (i.e., a height-to-width ratio) of a region 318 between adjacent spacers 314 of the test memory cell structure 300. That is, a distance between the gate stack 303a and the gate stack 303b may define the aspect ratio of the region 318 by controlling a distance between gate stacks 303a and 303b, which impacts the aspect ratio of the region 318. Thus, the pitch p may be selected so as to control the aspect ratio of the region 318 such that the aspect ratio of the region between the spacers 314 matches or is greater than a greatest aspect ratio of regions between adjacent spacers in memory cell devices in the memory region 202. For example, in some implementations, the aspect ratio of the region 318 may be in a range from approximately 6 to approximately 13. However, other values for the aspect ratio of the region 318 are within the scope of the present disclosure. In some implementations, the pitch p may be less than or equal to approximately 200 nanometers (nm), such as 200 nm, 190 nm, 180 nm, 170 nm, 160 nm, 150 nm, or the like. However, other values for the pitch p are within the scope of the present disclosure. In some implementations, a given test region 204 includes multiple test memory cell structures 300, and the pitch p may vary among the test memory cell structures 300 of the given test region 204. Variation of the pitch p among the test memory cell structure 300 in the given test region 204 may enable regions 318 in different test memory cell structures 300 to have different aspect ratios that can be monitored using a single test region 204.

Notably, the test memory cell structure 300 in some implementations does not include a floating gate layer. That is, in some implementations, neither of the gate stacks 303 in the test memory cell structure 300 include a floating gate layer. Memory cell devices in the memory region 202 would include a floating gate layer, as a floating gate layer is needed for operation of the memory cell device. However, because the test memory cell structure 300 is used for void and topography monitoring (rather than as a memory cell device), the test memory cell structure 300 need not include the floating gate layer. In this way, the test memory cell structure 300 is differently structured from the typical memory cell device of the semiconductor device 200. In some implementations, the removal of the floating gate layer from the test region 204 during formation of the test memory cell structure 300 enables the substrate 302 to be etched in the region between the gate stacks 303 during an etching of the floating gate in the memory region 202. Thus, the absence of the floating gate layer in the test region 204 facilitates formation of the test memory cell structure 300 concurrently with memory cell devices in the memory region 202.

Additionally, the test memory cell structure 300 includes raised portions of substrate 302 beneath the gate stacks 303. The formation of the polysilicon structures 312 in the region between the first raised portion of the substrate 302 and the second raised portion of the substrate 302 (e.g., within a recess in the substrate 302) enables the aspect ratio of the region 318 to be greater than that of the regions between adjacent spacers in memory cell devices in the memory region 202 because the substrate 302 does not include raised portions in the memory region 202 (e.g., a recess in the substrate 302 is not present between memory cell devices in the memory region 202). Thus, the test memory cell structure 300 may have a greater height than the typical memory cell device, thereby enabling the aspect ratio of the region 318 (e.g., between a spacer 314 on a right side of the gate stack 303a and a spacer 314 on a left side of the gate stack 303b in FIG. 3) to be greater than an aspect ratio of a region between spacers of a pair of adjacent memory cell devices in the memory region 202. In this way, the raised portions of the substrate 302 enable region 318 to be used to facilitate "worst case" void and topography monitoring for structures or layers in the regions between memory cell devices (e.g., without a need to monitor the memory cell devices themselves).

The number and arrangement of structures, layers, or the like shown in FIG. 3 are provided as examples. In practice, the test memory cell structure 300 may include additional structures and/or layers; fewer structures and/or layers; different structures and/or layers; and/or differently arranged structures and/or layers than those shown in FIG. 3. That is, as indicated above, FIG. 3 are provided as an example, and other examples may differ from what is described with regard to FIG. 3.

Figure 4A:
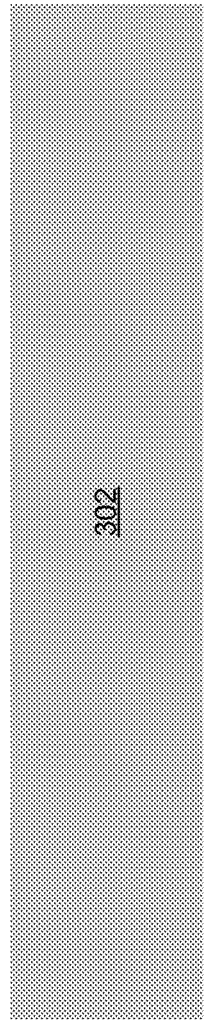
FIGS. 4A-4S are diagrams of an example implementation described herein.
Figure 4B:
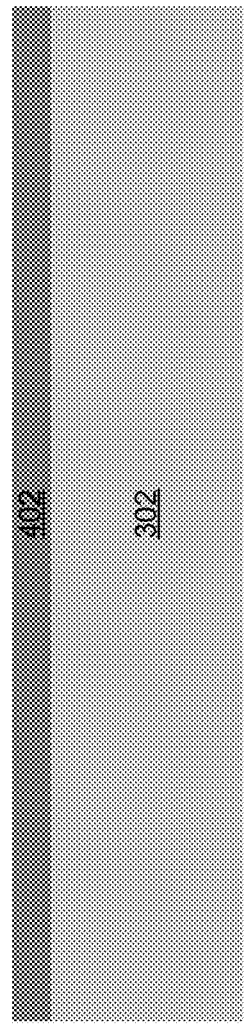
Figure 4C:
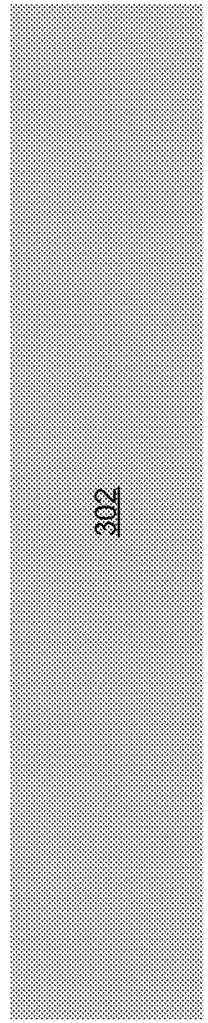
Figure 4D:
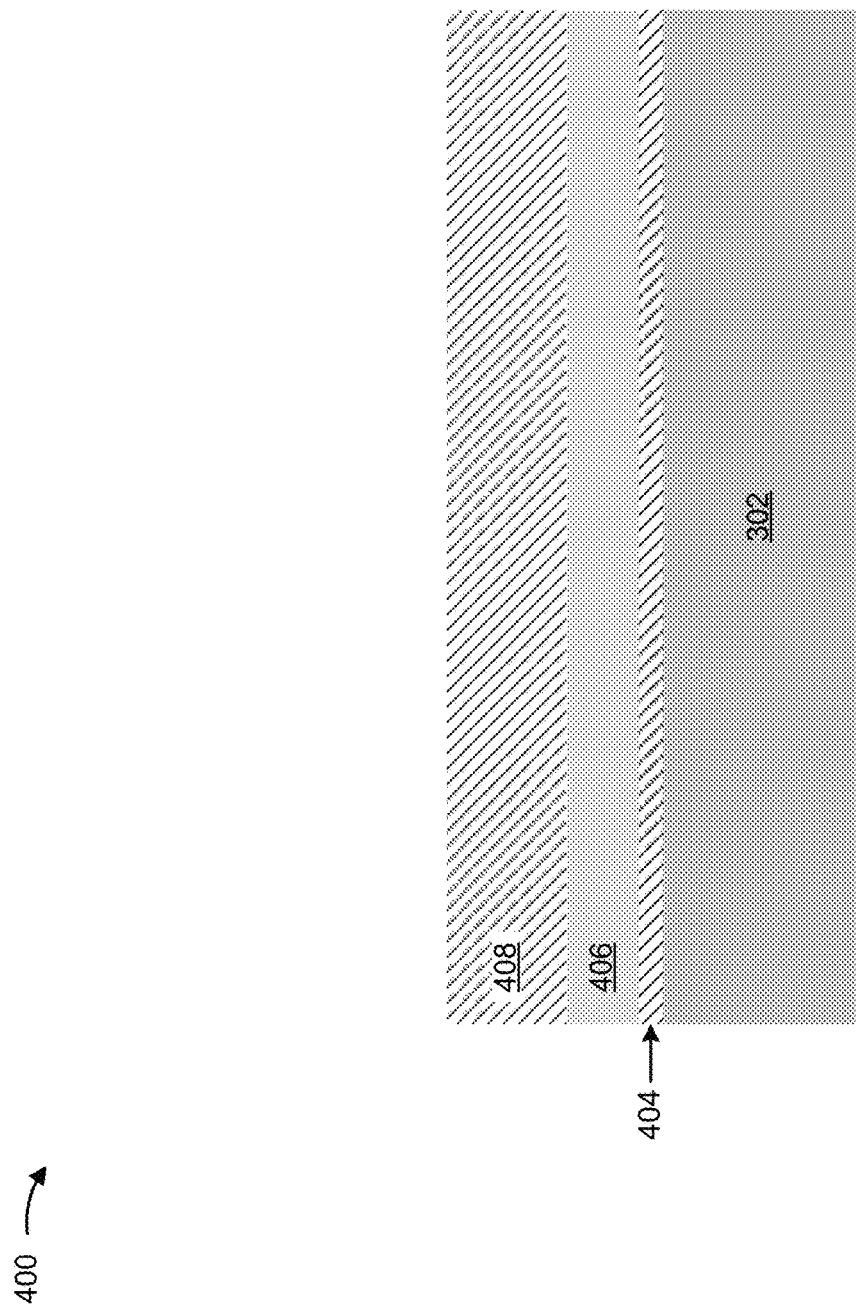
Figure 4E:
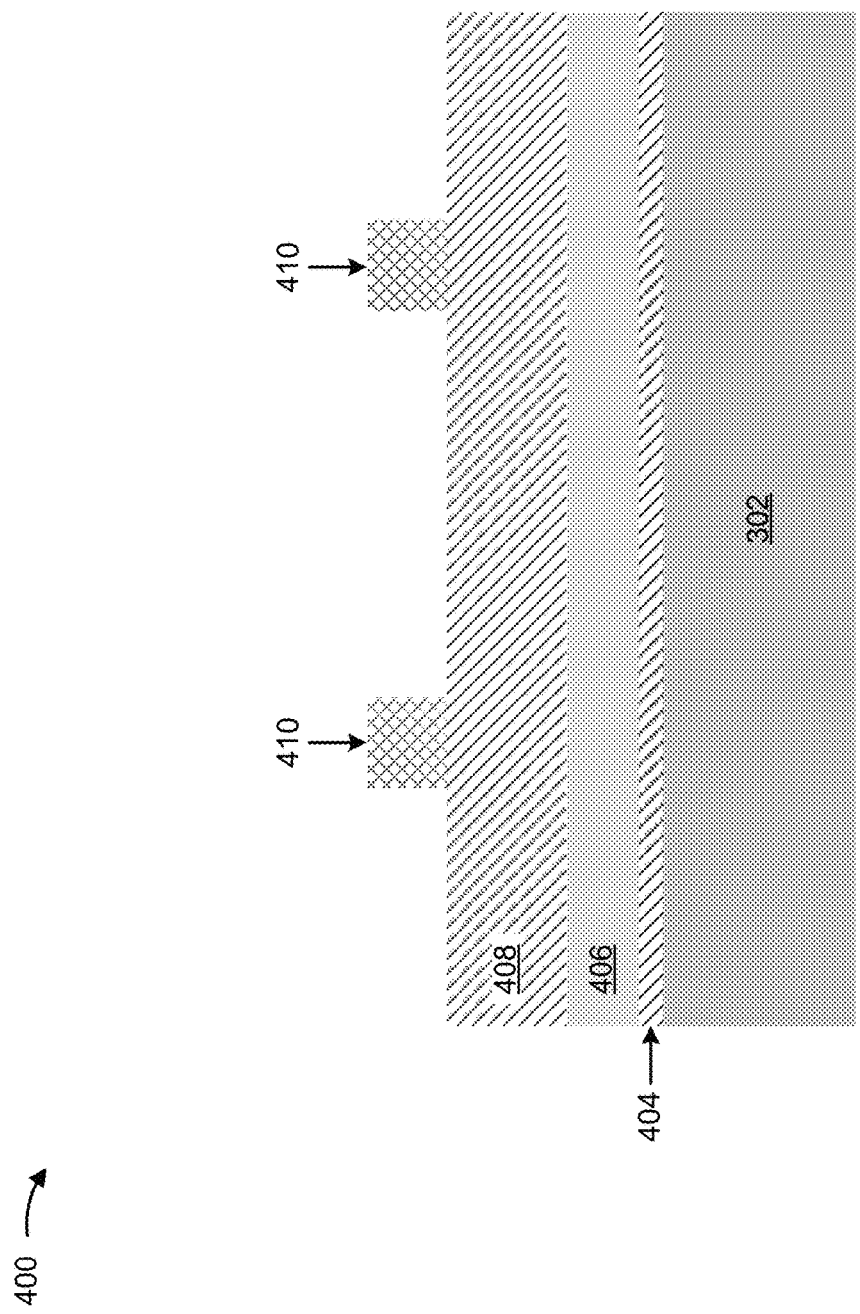
Figure 4F:
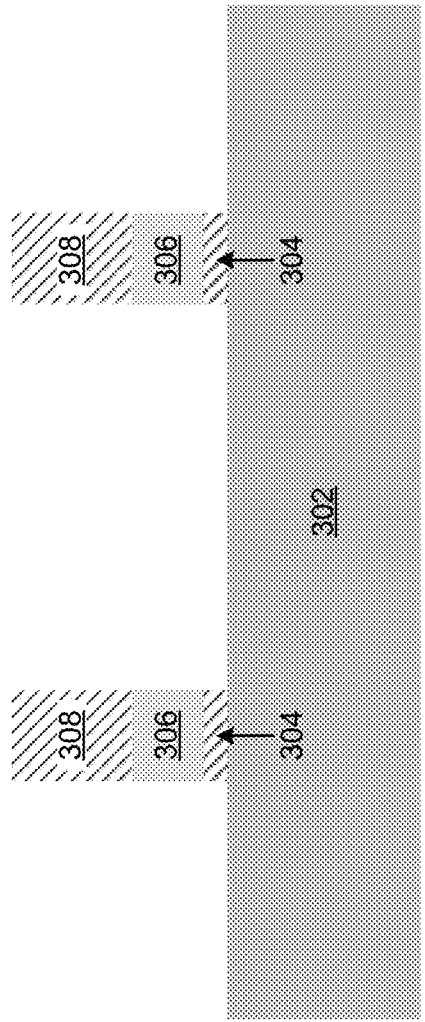
Figure 4G:
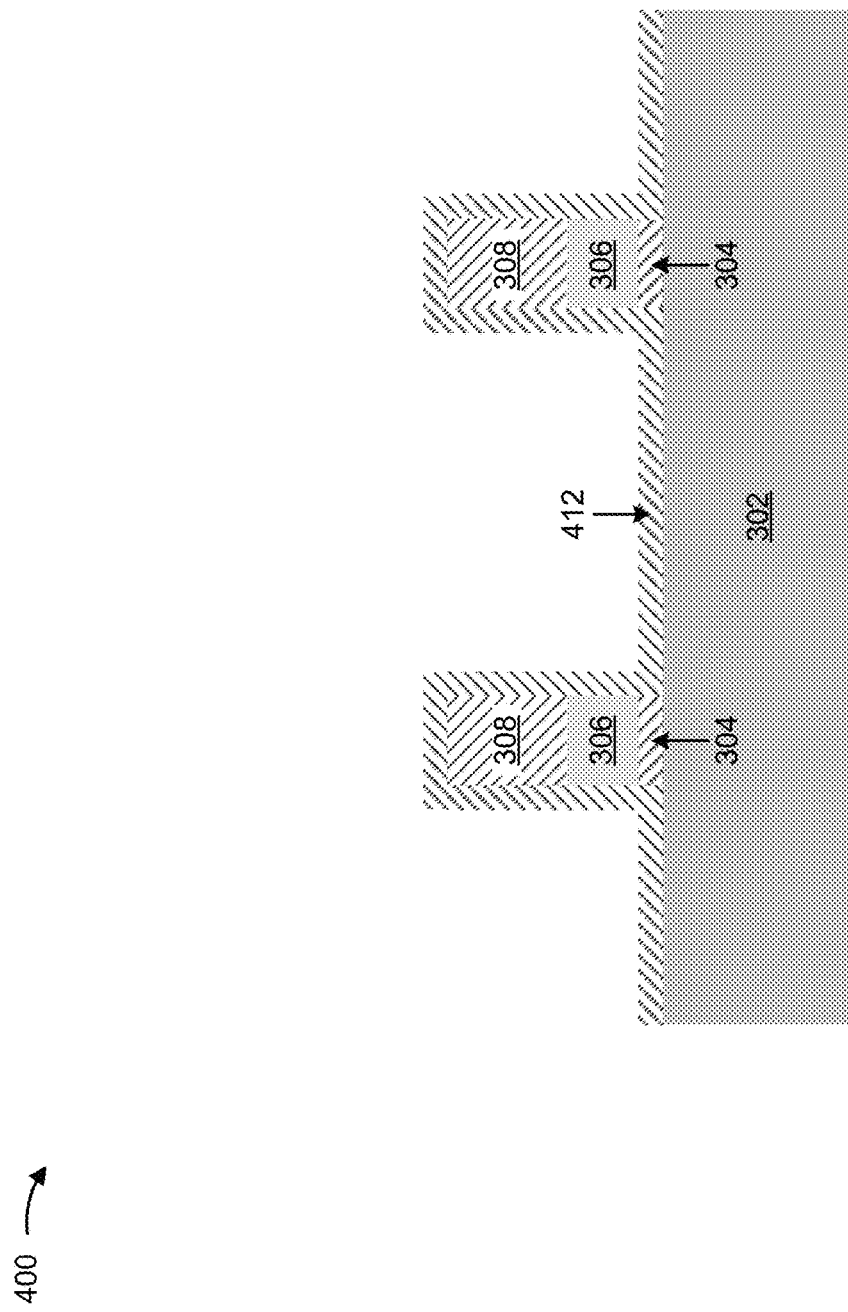
Figure 4I:
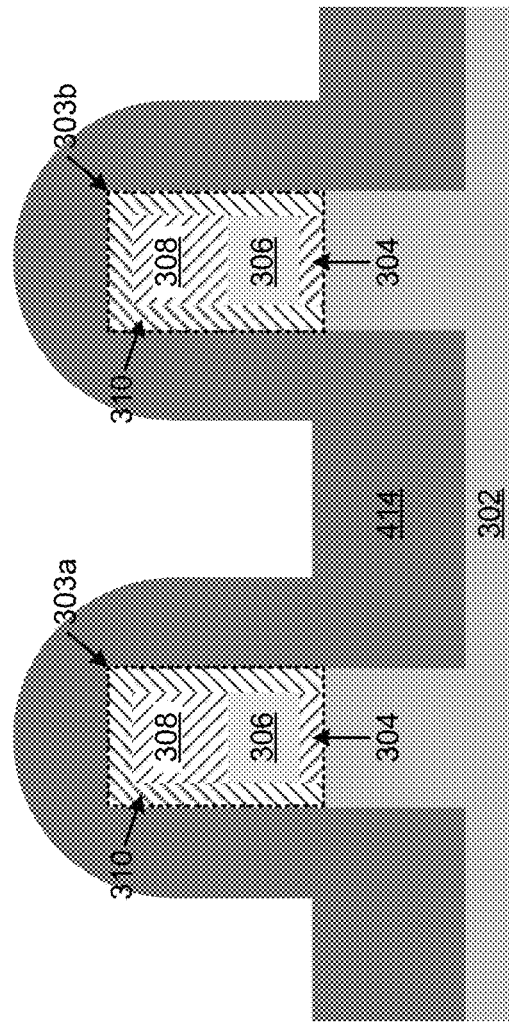
Figure 4J:
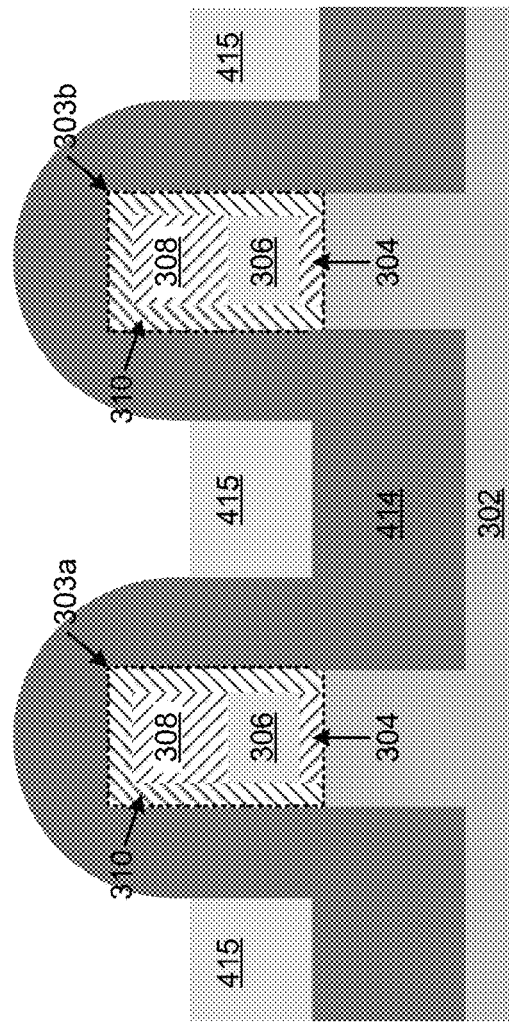
Figure 4K:
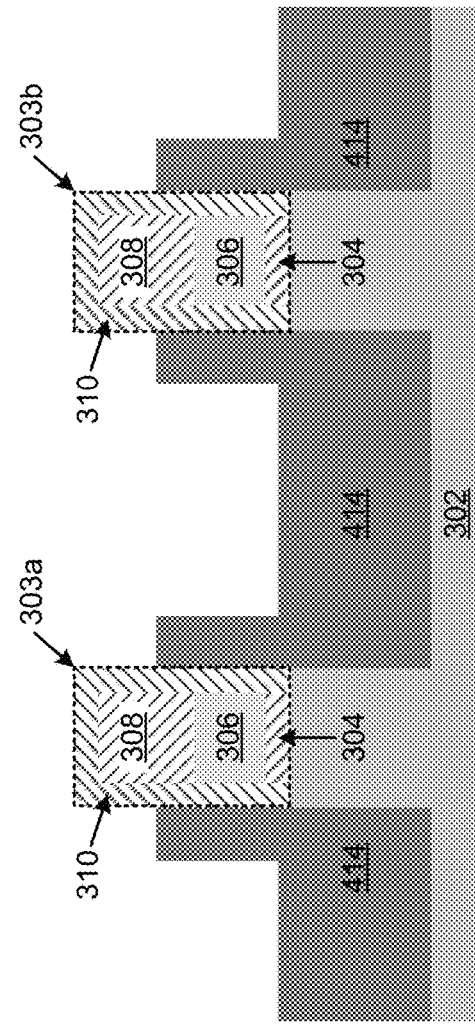
Figure 4L:
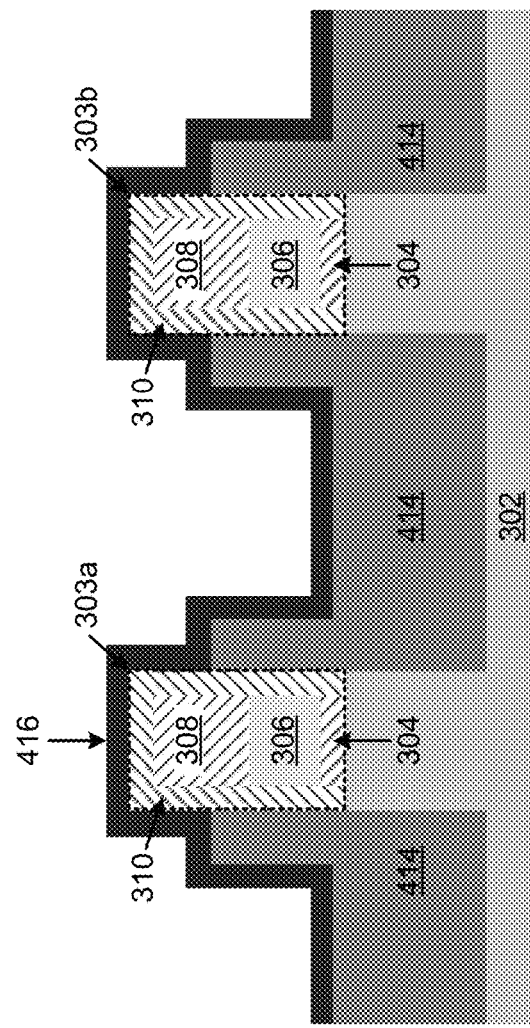
Figure 4M:
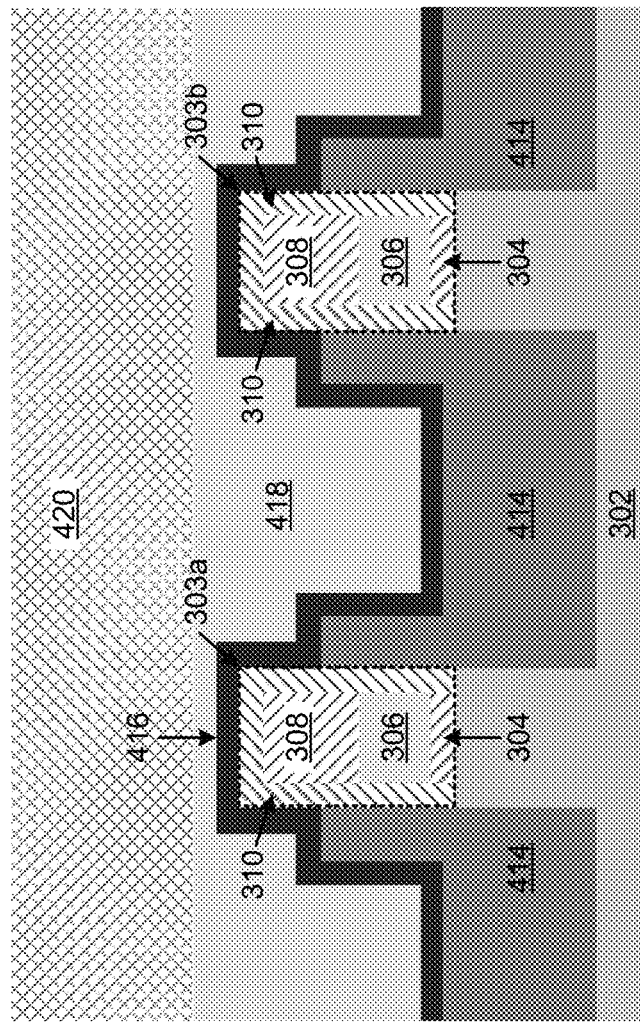
Figure 4N:
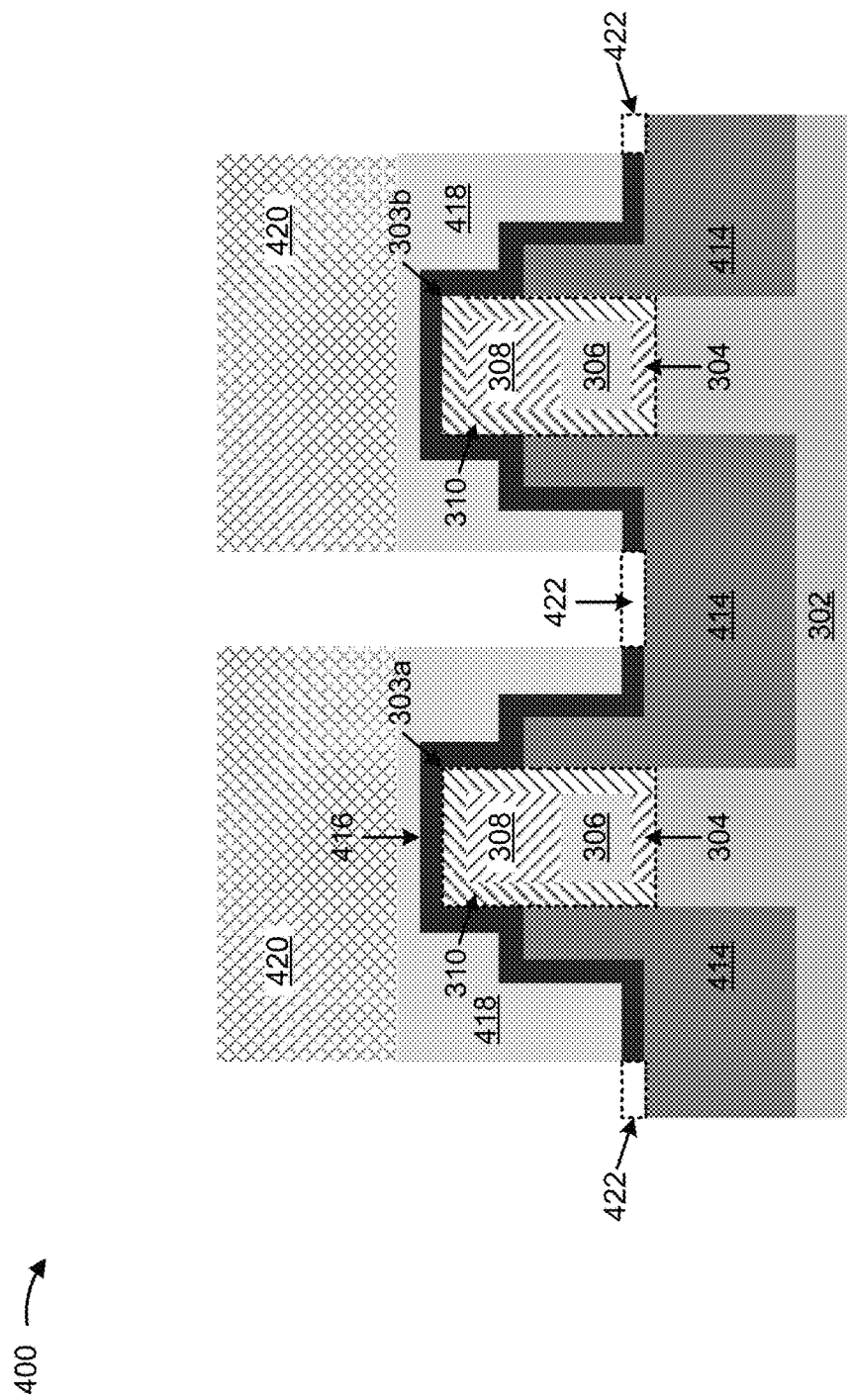
Figure 4O:
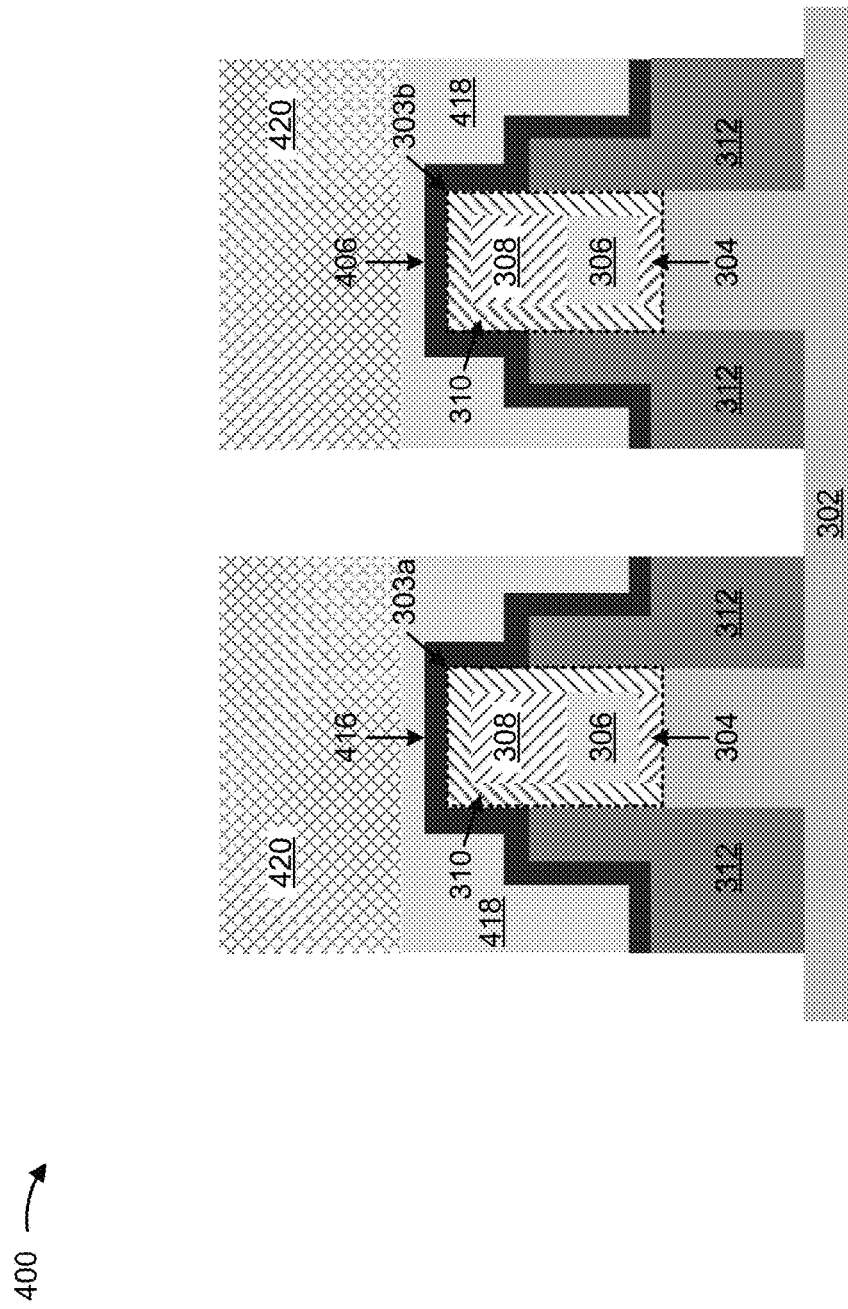
Figure 4P:
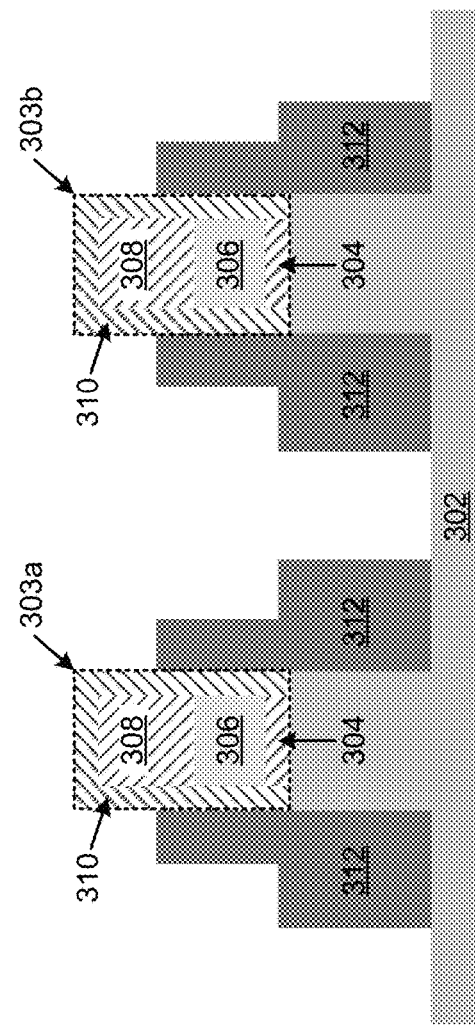
Figure 4Q:
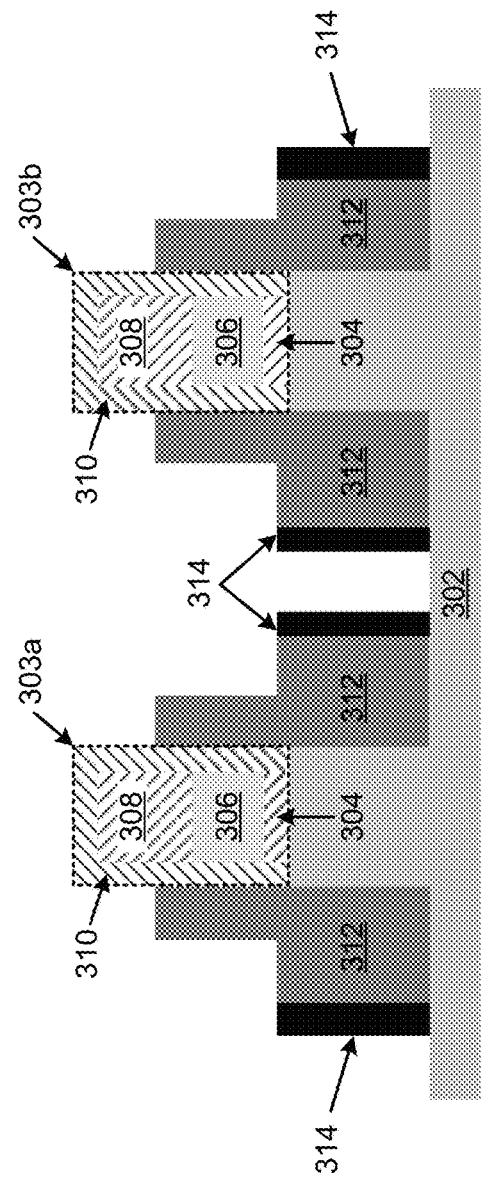
Figure 4R:
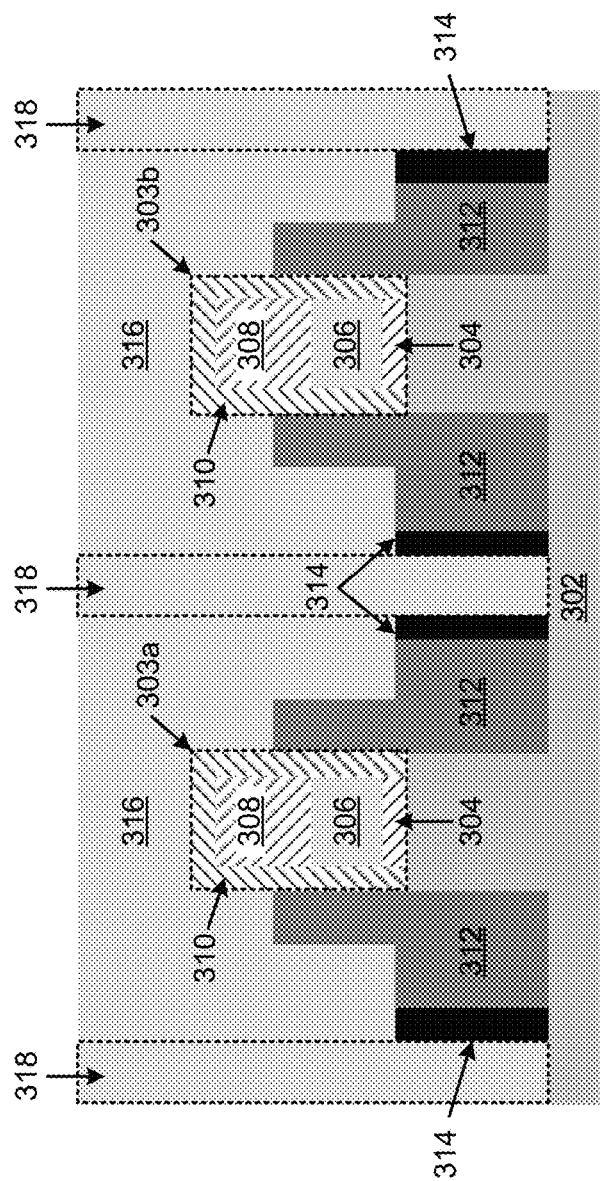
Figure 4S:
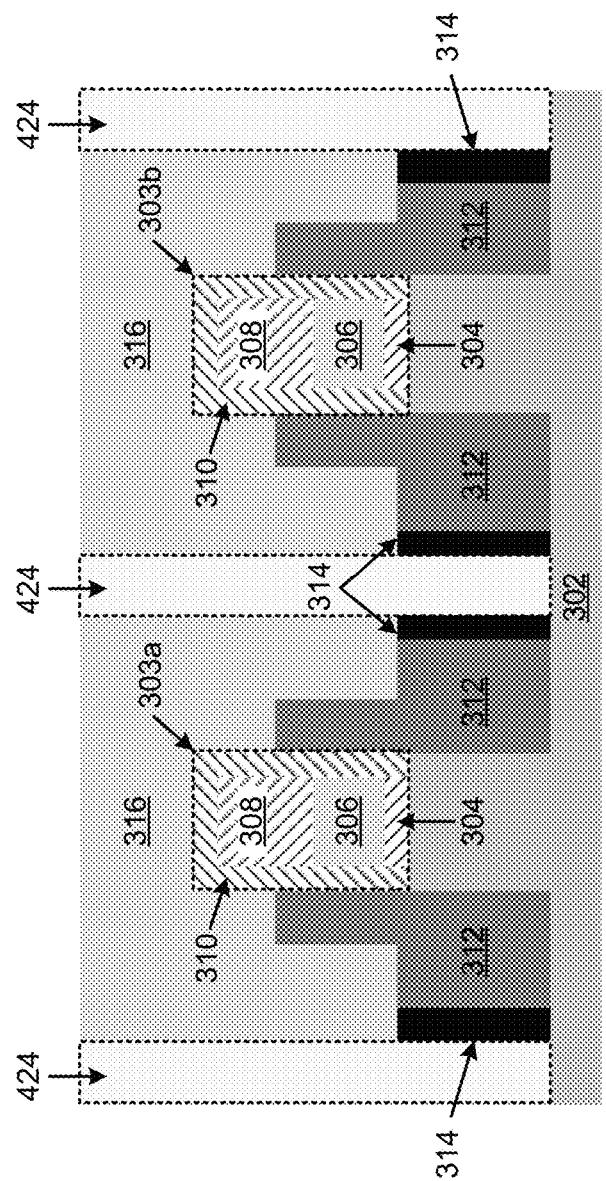

FIGS. 4A-4S are diagrams of an example implementation 400 of forming the test memory cell structure 300 described herein. Notably, FIGS. 4A-4S illustrate formation of the test memory cell structure 300 in a test region 204. In some implementations, the test memory cell structure 300 may be formed concurrently with formation of an array of memory cell devices in the memory region 202 (e.g., using the same sequence of semiconductor processing steps).

As shown in FIG. 4A, a substrate 302 is provided. In some implementations, the substrate 302 is a substrate on which one or more semiconductor devices 200 (including one or more test regions 204 and a memory region 202) are to be formed.

As shown in FIG. 4B, example implementation 400 may include forming a floating gate layer 402 on the substrate 302. In some implementations, the deposition tool 102 may deposit the floating gate layer 402 on the substrate 302. The deposition tool 102 may deposit the floating gate layer 402 in association with forming floating gates for memory cell devices in the memory region 202 of the semiconductor device 200 (not shown). In some implementations, a planarization tool (e.g., planarization tool 112) may polish and/or planarize the floating gate layer 402.

As shown in FIG. 4C, example implementation 400 may include removing the floating gate layer 402 from the substrate 302 in the test region 204. In some implementations, the floating gate layer 402 is removed from the test region 204 of the semiconductor device 200, while portions of the floating gate layer 402 may remain within the memory region 202 (e.g., the floating gate layer 402 may be etched to form floating gates for memory cell devices in the memory region 202). In some implementations, to remove the floating gate layer 402, the deposition tool 102 may deposit a photoresist layer on the floating gate layer 402 (e.g., by a spin coating operation). The exposure tool 104 may form a pattern in the photoresist layer by exposing the photoresist layer to a radiation source, such as a UV source (e.g., a deep UV light source, an extreme UV (EUV) light source, and/or the like), an x-ray source, or an electron beam (e-beam) source, to transfer the pattern from a photomask to the photoresist layer. The developer tool 106 may perform a development operation that includes one or more techniques to develop the pattern in the photoresist layer. The etch tool 108 may etch the floating gate layer 402 based on the pattern formed in the photoresist layer to remove the floating gate layer 402 from the test region 204. For example, the etch tool 108 may perform a wet etching technique (e.g., where the floating gate layer 402 is exposed or submerged in a chemical that etches or removes material at a particular etch rate), a dry etching device (e.g., where a plasma is used to sputter material), or another type of etching technique. The remaining portions of the photoresist layer may be removed by the removal tool 110 after the floating gate layer 402 is etched to remove the floating gate layer 402. As shown, in the example implementation 400, the floating gate layer 402 is removed from the test region 204 on which the test memory cell structure 300 is to be formed.

As shown in FIG. 4D, example implementation 400 may include forming a dielectric layer 404, a polysilicon layer 406, and a mask layer 408 over the substrate 302. The dielectric layer 404, the polysilicon layer 406, and the mask layer 408 are layers from which the dielectric regions 304, the polysilicon regions 306, and the mask regions 308, respectively, of the test memory cell structure 300 are to be formed in the test region 204. In some implementations, the deposition tool 102 may deposit the dielectric layer 404 on the substrate 302, may deposit the polysilicon layer 406 on the dielectric layer 404, and may deposit the mask layer 408 on the polysilicon layer 406. In some implementations, the planarization tool 112 may polish and/or planarize the dielectric layer 404 prior to deposition of the polysilicon layer 406, may polish and/or planarize the polysilicon layer 406 prior to deposition of the mask layer 408, and/or may polish and/or planarize the mask layer 408. In some implementations, the dielectric layer 404, the polysilicon layer 406, and the mask layer 408 are also layers from which structures of memory cell devices in the memory region 202 are to be formed.

As shown in FIG. 4E, example implementation 400 may include forming photoresist structures 410 on the mask layer 408. In some implementations, the photoresist structures 410 are used to define a width of the gate stacks 303 and the pitch p between the gate stacks 303, as described herein. In some implementations, to form the photoresist structures 410, the deposition tool 102 may deposit a photoresist layer on the mask layer 408 (e.g., by a spin coating operation). The exposure tool 104 may form a pattern in the photoresist layer by exposing the photoresist layer to a radiation source, such as a UV source (e.g., a deep UV light source, an extreme UV (EUV) light source, and/or the like), an x-ray source, or an electron beam (e-beam) source, to transfer the pattern from a photomask to the photoresist layer. The developer tool 106 may perform a development operation that includes one or more techniques to develop the pattern in the photoresist layer. In some implementations, the photoresist structures 410 are formed concurrently with photoresist structures in the memory region 202 that are used to define structures of the memory cell devices in the memory region 202.

As shown in FIG. 4F, example implementation 400 may include removing portions of the dielectric layer 404, the polysilicon layer 406, and the mask layer 408 to form the dielectric regions 304, the polysilicon regions 306, and the mask regions 308. In some implementations, the etch tool 108 may etch the dielectric layer 404, the polysilicon layer 406, and the mask layer 408 based on the pattern formed in the photoresist layer (e.g., the pattern that defines the photoresist structures 410) to remove the portions of the dielectric layer 404, the polysilicon layer 406, and the mask layer 408. For example, the etch tool 108 may perform a wet etching technique (e.g., where the dielectric layer 404, the polysilicon layer 406, and the mask layer 408 are exposed or submerged in a chemical that etches or removes material at a particular etch rate), a dry etching device (e.g., where a plasma is used to sputter material), or another type of etching technique. The photoresist structures 410 may be removed by the removal tool 110 after the dielectric layer 404, the polysilicon layer 406, and the mask layer 408 are etched to form the dielectric regions 304, the polysilicon regions 306, and the mask regions 308. In some implementations, the etch performed by the etch tool 108 is further used to define structures of the memory cell devices in the memory region 202 using photoresist structures formed in the memory region 202, as described above.

As shown in FIG. 4G, example implementation 400 may include forming a dielectric layer 412 on the substrate 302, the dielectric regions 304, the polysilicon regions 306, and the mask regions 308. The dielectric layer 412 is a layer from which the dielectric liners 310 of the test memory cell structure 300 are to be formed. In some implementations, a deposition tool (e.g., deposition tool 102) may deposit the dielectric layer 412 on the substrate 302, the dielectric regions 304, the polysilicon regions 306, and the mask regions 308. In some implementations, the dielectric layer 412 may also be formed in the memory region 202 in association with forming dielectric liners of the memory cell devices in the memory region 202.

As shown in FIG. 4H, example implementation 400 may include removing portions of the dielectric layer 412 and the substrate 302. In some implementations, removal of the portions of the dielectric layer 412 forms the gate stacks 303, and removal of the portion of the substrate 302 forms the first raised portion of the substrate 302 and the second raised portion of the substrate 302 on which the gate stack 303a and the gate stack 303b are arranged, respectively. In some implementations, to remove the portions of the dielectric layer 412 and the substrate 302, the deposition tool 102 may deposit a photoresist layer on the dielectric layer 412 (e.g., by a spin coating operation). The exposure tool 104 may form a pattern in the photoresist layer by exposing the photoresist layer to a radiation source, such as a UV source (e.g., a deep UV light source, an extreme UV (EUV) light source, and/or the like), an x-ray source, or an electron beam (e-beam) source, to transfer the pattern from a photomask to the photoresist layer. The developer tool 106 may perform a development operation that includes one or more techniques to develop the pattern in the photoresist layer. The etch tool 108 may etch the dielectric layer 412 and the substrate 302 based on the pattern formed in the photoresist layer to remove the portions of the dielectric layer 412 and the substrate 302. For example, the etch tool 108 may perform a wet etching technique (e.g., where the dielectric layer 412 and the substrate 302 are exposed or submerged in a chemical that etches or removes material at a particular etch rate), a dry etching device (e.g., where a plasma is used to sputter material), or another type of etching technique. The remaining portions of the photoresist layer may be removed by the removal tool 110 after the dielectric layer 412 and the substrate 302 are etched. In some implementations, the operations used to remove the portions of the dielectric layer 412 and the substrate 302 may be the same operations used to remove portions of the floating gate layer and/or one or more other layers from the memory regions 202 in association with forming structures of the memory cell devices in the memory region 202.

As shown in FIG. 4I, example implementation 400 may include forming a polysilicon layer 414 on the substrate 302 and the gate stacks 303. The polysilicon layer 414 is a layer from which the polysilicon structures 312 of the test memory cell structure 300 are to be formed. In some implementations, a deposition tool (e.g., deposition tool 102) may deposit the polysilicon layer 414 on the substrate 302 and the gate stacks 303. In some implementations, the polysilicon layer 414 may also be formed in the memory region 202 in association with forming a layer from which one or more structures (e.g., word lines, erase gates, or the like) of the memory cell devices in the memory region 202 are to be formed.

As shown in FIG. 4J, example implementation 400 may include forming a BARC layer 415 over at least a portion of the polysilicon layer 414. In some implementations, the deposition tool 102 may deposit the BARC layer 415 on the polysilicon layer 414 using a spin-coating technique, as described above. In some implementations, the BARC layer 415 may also be formed in the memory region 202 in association with forming a layer to be used for forming one or more structures (e.g., word lines, erase gates, or the like) of the memory cell devices in the memory region 202. In some implementations, the topography structures of the semiconductor device 200 (e.g., in the memory region 202, in the test region 204) may cause a "worst case" thickness of the BARC layer 415 to be present in the test memory cell structure 300 in the test region 204, as described above.

As shown in FIG. 4K, example implementation 400 may include removing a portion of the polysilicon layer 414. In some implementations, removal of the portion of the polysilicon layer 414 is performed in association with forming the polysilicon structures 312. For example, the etch tool 108 may perform one or more ech operations to remove an exposed portions of the polysilicon layer 414 (e.g., portions of the polysilicon layer 414 not covered by the BARC layer 415). Here, the BARC layer 415 prevents portions of the polysilicon layer 414 (e.g., a portion of the polysilicon layer 414 between the first raised portion of the substrate 302 and the second raised portion of the substrate 302) from being removed during the one or more etch operations. After etching of the polysilicon layer 414 to form the polysilicon structures 312, the removal tool 110 may remove the BARC layer 415 from the remaining portions of the polysilicon layer 414. In some implementations, the etch or removal operations used in association with removing the portions of the polysilicon layer 414 may be the same etch or removal operations used to form one or more structures (e.g., word lines, erase gates, or the like) of the memory cell devices in the memory region 202 from the polysilicon layer 414.

As shown in FIG. 4L, example implementation 400 may include forming a hard mask 416 over the gate stacks 303 and the polysilicon layer 414. The hard mask 416 is a layer used to mask one or more other structures of the test memory cell structure 300 (e.g., the gate stacks 303, portions of the polysilicon layer 414) in association with forming the test memory cell structure 300. In some implementations, the deposition tool 102 may deposit the hard mask 416 over the gate stacks 303 and the polysilicon layer 414. In some implementations, the hard mask 416 may include, for example, silicon oxide, silicon nitride, silicon oxynitride, another nitride, another oxide, or a metal material. In some implementations, the hard mask 416 may also be formed in the memory region 202 in association with forming a mask associated with forming one or more structures (e.g., word lines, erase gates, or the like) of the memory cell devices in the memory region 202.

As shown in FIG. 4M, example implementation 400 may include forming a BARC layer 418 over the hard mask 416 and forming a photoresist layer 420 over the BARC layer 418. The BARC layer 418 used to prevent radiation used to pattern the photoresist layer 420 from being reflected by lower layers of the semiconductor device 200 (e.g., to improve quality of an etch performed using the patterned photoresist layer 420). In some implementations, the deposition tool 102 may deposit the BARC layer 418 on the hard mask 416 using a spin-coating technique, as described above. In some implementations, the BARC layer 418 and the photoresist layer 420 may also be formed in the memory region 202 in association with forming a layer to be used for forming one or more structures (e.g., word lines, erase gates, or the like) of the memory cell devices in the memory region 202. In some implementations, the topography structures of the semiconductor device 200 (e.g., in the memory region 202, in the test region 204) may cause a "worst case" thickness of the BARC layer 418 to be present in the test memory cell structure 300 in the test region 204, as described above.

As shown in FIG. 4N, example implementation 400 may include forming openings 422 in the hard mask 416. In some implementations, the openings 422 define a width of a region between polysilicon structures 312 of the test memory cell structure 300. In some implementations, the exposure tool 104 may form a pattern in the photoresist layer 420 by exposing the photoresist layer 420 to a radiation source, such as a UV source (e.g., a deep UV light source, an extreme UV (EUV) light source, and/or the like), an x-ray source, or an electron beam (e-beam) source, to transfer the pattern from a photomask to the photoresist layer. Here, the BARC layer 418 acts to prevent reflection of the radiation by lower layers of the test memory cell structure 300. The developer tool 106 may perform a development operation that includes one or more techniques to develop the pattern in the photoresist layer 420. The etch tool 108 may etch the BARC layer 418 and the hard mask 416 based on the pattern formed in the photoresist layer 420 to remove portions of the hard mask 416 to form the openings 422. For example, the etch tool 108 may perform a wet etching technique (e.g., where the BARC layer 418 and the hard mask 416 are exposed or submerged in a chemical that etches or removes material at a particular etch rate), a dry etching device (e.g., where a plasma is used to sputter material), or another type of etching technique. In some implementations, the operations used to form the openings 422 may be the same operations used to form openings in the hard mask 416 in association with defining one or more structures (e.g., word lines, erase gates, or the like) of the memory cell devices in the memory region 202.

As shown in FIG. 4O, example implementation 400 may include forming polysilicon structures 312 from the polysilicon layer 414. In some implementations, the widths of the polysilicon structures 312 are defined by the width of the openings 422 in the hard mask 416. In some implementations, the etch tool 108 may etch the polysilicon layer 414 based on the pattern formed in the photoresist layer 420 to remove portions of the polysilicon layer 414 to form the openings 422. For example, the etch tool 108 may perform a wet etching technique (e.g., where the polysilicon layer 414 is exposed or submerged in a chemical that etches or removes material at a particular etch rate), a dry etching device (e.g., where a plasma is used to sputter material), or another type of etching technique. The remaining portions of the BARC layer 418 and the photoresist layer 420 may be removed by the removal tool 110 after the polysilicon layer 414 is etched to form the polysilicon structures 312. In some implementations, the operations used to etch the polysilicon layer 414 may be the same operations used to define one or more structures (e.g., word lines) of the memory cell devices in the memory region 202.

As shown in FIG. 4P, example implementation 400 may include removing the hard mask 416 from the gate stacks 303 and the polysilicon structures 312. For example, the removal tool 110 may remove the remaining portions of the hard mask 416 from the gate stacks 303 and the polysilicon structures 312 after formation of the polysilicon structures 312. In some implementations, the operation used to remove the hard mask 416 may be the same operation used to remove the hard mask 416 from one or more structures of the memory cell devices in the memory region 202.

As shown in FIG. 4Q, example implementation 400 may include forming the spacers 314 adjacent to the polysilicon structures 312. For example, the deposition tool 102 may deposit a conformal spacer layer (e.g., a layer from which the spacers 314 are to be formed along the polysilicon structures 312). In some implementations, to form the spacers 314 from the conformal spacer layer, the deposition tool 102 may deposit a photoresist layer between and over the polysilicon structures 312, and the exposure tool 104 may form a pattern in the photoresist layer by exposing the photoresist layer to a radiation source, such as a UV source (e.g., a deep UV light source, an extreme UV (EUV) light source, and/or the like), an x-ray source, or an electron beam (e-beam) source, to transfer the pattern from a photomask to the photoresist layer. The developer tool 106 may perform a development operation that includes one or more techniques to develop the pattern in the photoresist layer. The etch tool 108 may then etch the conformal spacer layer based on the pattern formed in the photoresist layer to form the spacers 314. The removal tool 110 may then remove the remaining portions of the photoresist layer. In some implementations, the operations used to form the spacers 314 may be the same operations used to form spacers of the memory cell devices in the memory region 202.

As shown in FIG. 4R, example implementation 400 may include forming the ILD layer 316 over the test memory cell structure 300. In some implementations, the deposition tool 102 may deposit the ILD layer 316 of the test memory cell structure 300. In some implementations, the planarization tool 112 may polish and/or planarize the ILD layer 316. In some implementations, the deposition operation used to form the ILD layer 316 may be the same deposition operation used to form an ILD layer over the memory cell devices in the memory region 202.

As shown in FIG. 4R, the ILD layer 316 is formed in the region 318 between adjacent spacers 314 of the gate stack 303a and the gate stack 303b. In some implementations, as shown, the region 318 extends from a surface of the ILD layer 316 to or near the substrate 302 in a region between the gate stacks 303 (i.e., the region between the first raised portion of the substrate 302 and the second raised portion of the substrate 302). In some implementations, gap filling performance of the ILD layer 316 in the portion of the region 318 between the adjacent spacers 314 may be monitored to assess gap filling performance for the semiconductor device 200. For example, the region 318 may be configured to have an aspect ratio that matches or is greater than an aspect ratio of corresponding regions between adjacent memory cell devices in the memory region 202. Therefore, gap filling performance in the region 318 may be monitored in order to assess whether voids may be present in the corresponding regions between the adjacent memory cell devices in the memory region 202.

As shown in FIG. 4S, example implementation 400 may include forming a recess 424 in the region 318. In some implementations, to form the recess 424, the deposition tool 102 may deposit a photoresist layer on the ILD layer 316 (e.g., by a spin coating operation). The exposure tool 104 may form a pattern in the photoresist layer by exposing the photoresist layer to a radiation source, such as a UV source (e.g., a deep UV light source, an extreme UV (EUV) light source, and/or the like), an x-ray source, or an electron beam (e-beam) source, to transfer the pattern from a photomask to the photoresist layer. The developer tool 106 may perform a development operation that includes one or more techniques to develop the pattern in the photoresist layer. The etch tool 108 may etch the ILD layer 316 based on the pattern formed in the photoresist layer to from the recess 424. For example, the etch tool 108 may perform a wet etching technique (e.g., where the ILD layer 316 is exposed or submerged in a chemical that etches or removes material at a particular etch rate), a dry etching device (e.g., where a plasma is used to sputter material), or another type of etching technique. The remaining portions of the photoresist layer may be removed by the removal tool 110 after the ILD layer 316 is etched. In some implementations, the operations used to form the recess 424 may be the same operations used to form contact etches through the ILD layer 316 in the memory regions 202 in association with forming contact plugs for the memory cell devices in the memory region 202. Thus, in some implementations, the recess 424 (and subsequent filing thereof) can be used in association with monitoring formation of the contact plugs of the memory cell devices in the memory region 202.

As indicated above, FIGS. 4A-4S are provided as an example. Other examples may differ from what is described with regard to FIGS. 4A-4S.

Figure 5:
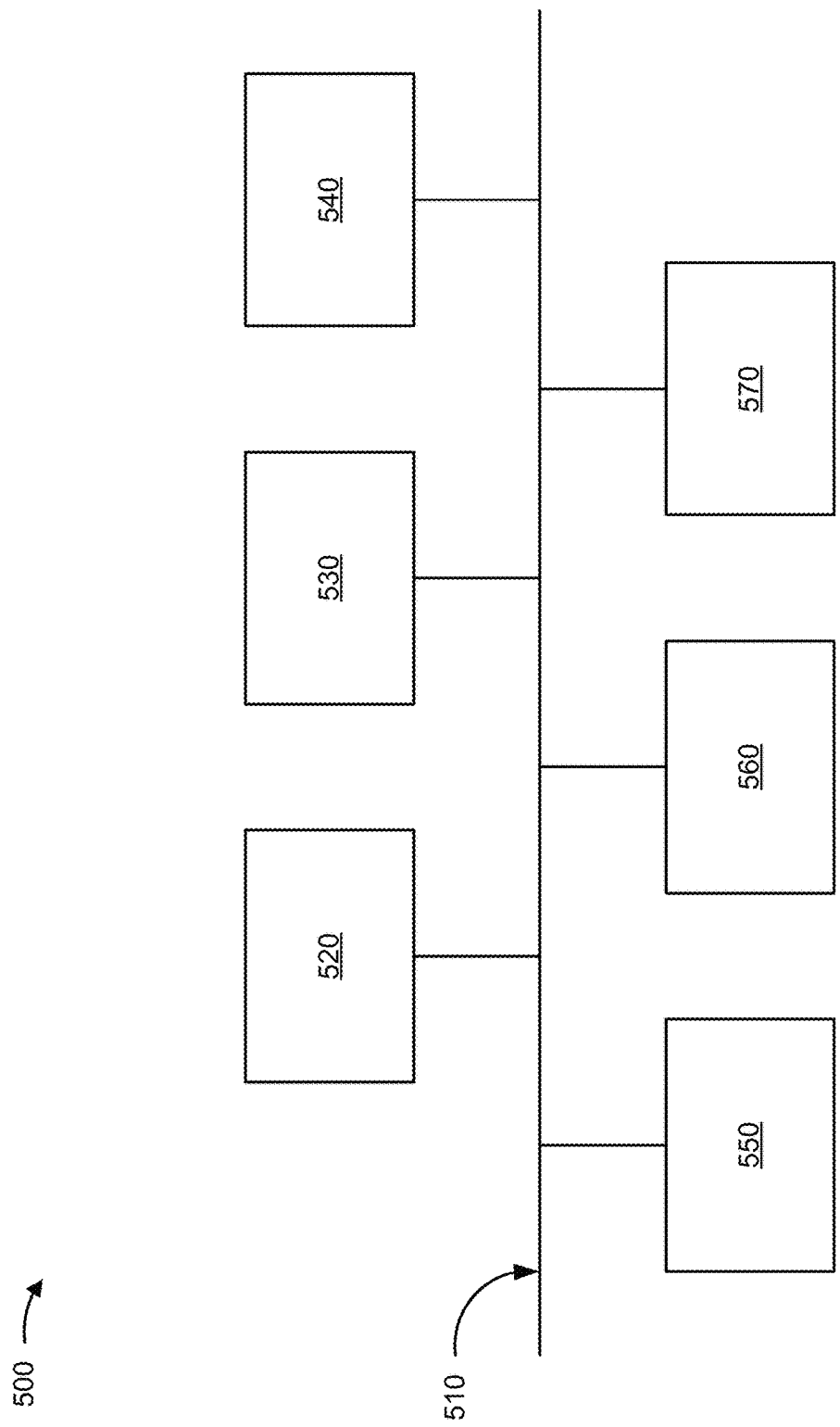
FIG. 5 is a diagram of example components of one or more devices of FIG. 1.

FIG. 5 is a diagram of example components of a device 500, which may correspond to a deposition tool 102, an exposure tool 104, a developer tool 106, an etch tool 108, a removal tool 110, a planarization tool 112, an implantation tool 114, and/or wafer/die handling device 116. In some implementations, the deposition tool 102, the exposure tool 104, the developer tool 106, the etch tool 108, the removal tool 110, the planarization tool 112, the implantation tool 114, and/or the wafer/die handling device 116 may include one or more devices 500 and/or one or more components of device 500. As shown in FIG. 5, device 500 may include a bus 510, a processor 520, a memory 530, a storage component 540, an input component 550, an output component 560, and a communication component 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, and/or an actuator. Output component 560 enables device 500 to provide output, such as via a display, a speaker, and/or one or more light-emitting diodes. Communication component 570 enables device 500 to communicate with other devices, such as via a wired connection and/or a wireless connection. For example, communication component 570 may include a receiver, a transmitter, a transceiver, a modem, a network interface card, and/or an antenna.

Device 500 may perform one or more processes described herein. For example, a non-transitory computer-readable medium (e.g., memory 530 and/or storage component 540) may store a set of instructions (e.g., one or more instructions, code, software code, and/or program code) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
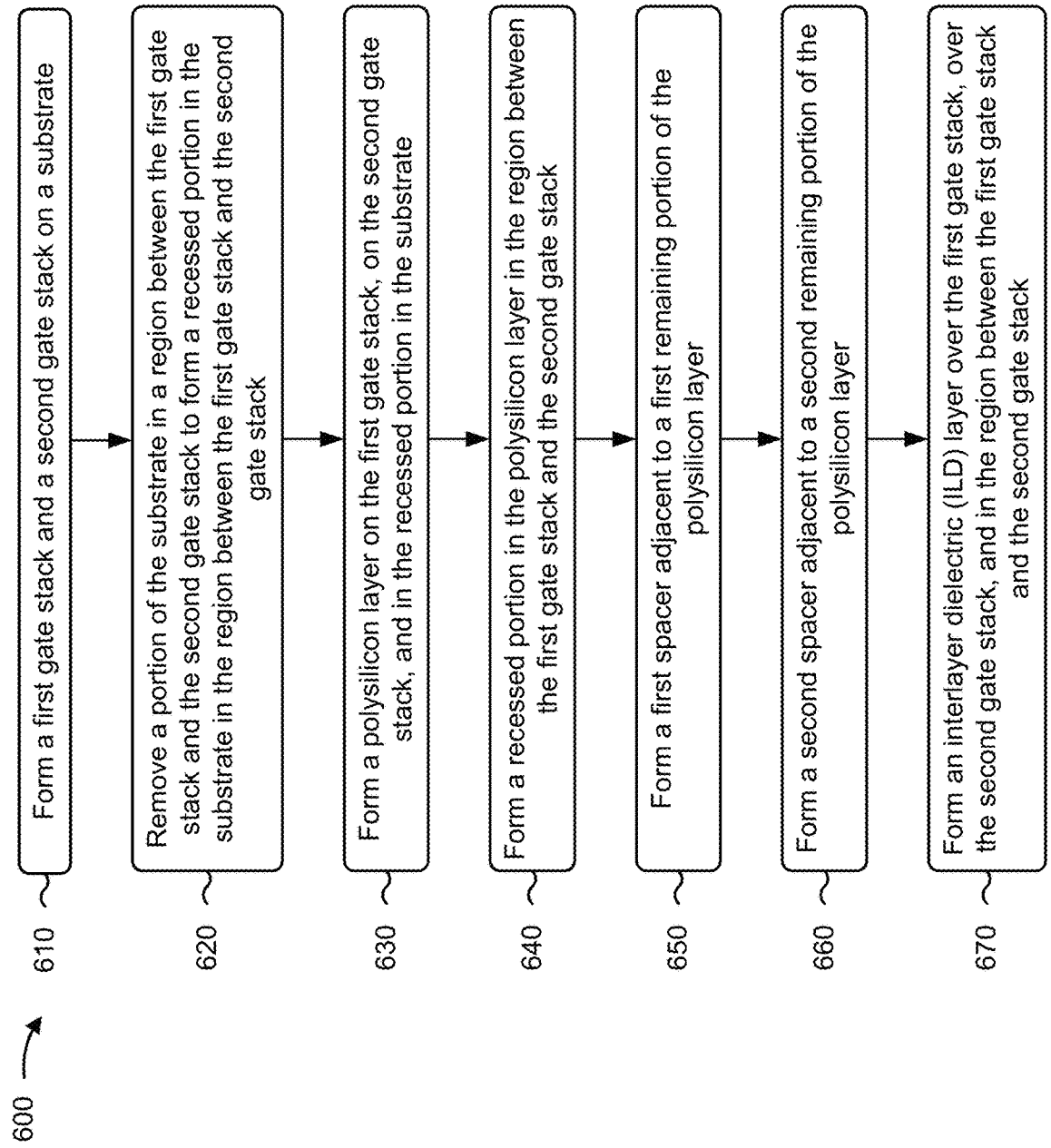
FIG. 6 is a flowchart of an example process relating to forming a test structure for void and topography monitoring.

FIG. 6 is a flowchart of an example process 600 relating to forming a test memory cell structure for void and topography monitoring. In some implementations, one or more process blocks of FIG. 6 may be performed by one or more semiconductor processing tools (e.g., one or more semiconductor processing tools 102-116). Additionally, or alternatively, one or more process blocks of FIG. 6 may be performed by one or more components of device 500, such as processor 520, memory 530, storage component 540, input component 550, output component 560, and/or communication component 570.

As shown in FIG. 6, process 600 may include forming a first gate stack and a second gate stack on a substrate (block 610). For example, the one or more semiconductor processing tools may form a first gate stack (e.g., gate stack 303a) and a second gate stack (e.g., gate stack 303b) on a substrate (e.g., substrate 302), as described above.

As further shown in FIG. 6, process 600 may include removing a portion of the substrate in a region between the first gate stack and the second gate stack to form a recessed portion in the substrate in the region between the first gate stack and the second gate stack (block 620). For example, the one or more semiconductor processing tools may remove a portion of the substrate in a region between the first gate stack and the second gate stack to form a recessed portion in the substrate in the region between the first gate stack and the second gate stack, as described above.

As further shown in FIG. 6, process 600 may include forming a polysilicon layer on the first gate stack, on the second gate stack, and in the recessed portion in the substrate (block 630). For example, the one or more semiconductor processing tools may form a polysilicon layer (e.g., polysilicon layer 414) on the first gate stack, on the second gate stack, and in the recessed portion in the substrate, as described above.

As further shown in FIG. 6, process 600 may include forming a recessed portion in the polysilicon layer in the region between the first gate stack and the second gate stack (block 640). For example, the one or more semiconductor processing tools may form a recessed portion in the polysilicon layer in the region between the first gate stack and the second gate stack, as described above.

As further shown in FIG. 6, process 600 may include forming a first spacer adjacent to a first remaining portion of the polysilicon layer (block 650). For example, the one or more semiconductor processing tools may form a first spacer (e.g., spacer 314) adjacent to a first remaining portion of the polysilicon layer, as described above.

As further shown in FIG. 6, process 600 may include forming a second spacer adjacent to a second remaining portion of the polysilicon layer (block 660). For example, the one or more semiconductor processing tools may form a second spacer (e.g., spacer 314) adjacent to a second remaining portion of the polysilicon layer, as described above.

As further shown in FIG. 6, process 600 may include forming an ILD layer over the first gate stack, over the second gate stack, and in the region between the first gate stack and the second gate stack (block 670). For example, the one or more semiconductor processing tools may form an ILD layer (e.g., ILD layer 316) over the first gate stack, over the second gate stack, and in the region between the first gate stack and the second gate stack, as described above.

Process 600 may include additional implementations, such as any single implementation or any combination of implementations described below and/or in connection with one or more other processes described elsewhere herein.

In a first implementation, process 600 includes removing a floating gate layer (e.g., floating gate layer 402) from the substrate prior to forming the first gate stack and the second gate stack.

In a second implementation, alone or in combination with the first implementation, the first gate stack and the second gate stack are formed in a test region (e.g., test region 204) of the substrate, the test region being separate from a memory region (e.g., memory region 202) in which an array of memory cell devices are formed.

In a third implementation, alone or in combination with any of the first and second implementations, the test region is one of a plurality of test regions, the plurality of test regions being arranged around the memory region.

In a fourth implementation, alone or in combination with any of the first through third implementations, a pitch between the first gate stack and the second gate stack is different from a pitch between a third gate stack and a fourth gate stack in the test region.

In a fifth implementation, alone or in combination with any of the first through fourth implementations, a height-to-width ratio of a region between the first spacer and the second spacer is greater than a height-to-width ratio of a region between spacers of a pair of adjacent memory cell devices in the array of memory cell devices.

In a sixth implementation, alone or in combination with any of the first through fifth implementations, process 600 includes forming a recess (e.g., recess 424) in the ILD layer in a region between the first spacer and the second spacer, the recess extending from a surface of the ILD layer to the substrate.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, a test memory cell structure 300 may be configured to enable void and topography monitoring in a semiconductor device 200 (e.g., a flash memory device). For example, in some implementations, the test memory cell structure 300, arranged in the test region 204, is formed so that an aspect ratio of a region 318 between gate stacks 303 of the test memory cell structure 300 is configured to match or be greater than a "worst case" aspect ratio among regions between gate stacks of memory cell devices in a memory region 202. The region 318 formed in the test memory cell structure 300 can, therefore, be used for void and topography monitoring to, for example, determine performance of a BARC layer deposition and/or whether regions between the memory cell devices in the memory region 202 are formed according to specification (e.g., such that gap filling performance of the ILD layer 316 is acceptable). That is, the test memory cell structure 300 can be monitored to determine whether one or more structures or layers are properly formed in memory cell devices and/or whether voids are present in regions between memory cell devices of the semiconductor device 200 (e.g., without a need to monitor the memory cell devices themselves). In some implementations, the test memory cell structure may be used to increase yield and/or may improve cycle times associated with fabricating the semiconductor device 200 (e.g., by reducing an amount of time used to perform over-etching).

As described in greater detail above, some implementations described herein provide a semiconductor device. The semiconductor device includes a memory region including an array of memory cell devices. The semiconductor device includes a test region including a test memory cell structure, the test memory cell structure including, a first gate stack on a first raised portion of a substrate, a first polysilicon structure adjacent to the first raised portion and in a region between the first raised portion and a second raised portion of the substrate, a first spacer adjacent to the first polysilicon structure in the region between the first raised portion and the second raised portion, and a second gate stack on the second raised portion, a second polysilicon structure adjacent to the second raised portion and in the region between the first raised portion and the second raised portion, and a second spacer adjacent to the second polysilicon structure in the region between the first raised portion and the second raised portion. The semiconductor device includes an ILD layer over at least a portion of the memory region and at least a portion of the test region.

As described in greater detail above, some implementations described herein provide a method. The method includes forming a first gate stack and a second gate stack on a substrate. The method includes removing a portion of the substrate in a region between the first gate stack and the second gate stack to form a recessed portion in the substrate in the region between the first gate stack and the second gate stack. The method includes forming a polysilicon layer on the first gate stack, on the second gate stack, and in the recessed portion in the substrate. The method includes forming a recessed portion in the polysilicon layer in the region between the first gate stack and the second gate stack. The method includes forming a first spacer adjacent to a first remaining portion of the polysilicon layer. The method includes forming a second spacer adjacent to a second remaining portion of the polysilicon layer. The method includes forming an ILD layer over the first gate stack, over the second gate stack, and in the region between the first gate stack and the second gate stack.

As described in greater detail above, some implementations described herein provide a test structure. The test structure includes a substrate including a first raised portion and a second raised portion. The test structure includes a first layer stack on the first raised portion. The test structure includes a second layer stack on the second raised portion. The test structure includes one or more first structures on a side of the first raised portion nearest to the second raised portion. The test structure includes one or more second structures on a side of the second raised portion nearest to the first raised portion. The test structure includes a dielectric layer over the first layer stack, over the second layer stack, over the one or more first structures, over the one or more second structures, and in a region between the one or more first structures and the one or more second structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a test region including a test memory cell structure, the test memory cell structure including:
a first gate stack on a first raised portion of a substrate, wherein the first gate stack comprises a first dielectric material, a first polysilicon material above the first dielectric material, and one or more additional dielectric materials above the first polysilicon material,
a first polysilicon structure on a side of the first raised portion and in a region between the side of the first raised portion and a side of a second raised portion of the substrate, wherein no other raised portions are between the first raised portion and the second raised portion,
a first spacer adjacent to on a side of the first polysilicon structure in the region between the side of the first raised portion and the side of the second raised portion,
a second gate stack on the second raised portion, wherein the second gate stack comprises a second dielectric material, a second polysilicon material above the second dielectric material, and one or more other dielectric materials above the second polysilicon material,
a second polysilicon structure on the side of the second raised portion and in the region between the side of the first raised portion and the side of the second raised portion, and
a second spacer on a side of the second polysilicon structure in the region between the side of the first raised portion and the side of the second raised portion; and
an interlayer dielectric (ILD) layer over at least a portion of the test region.

2. The semiconductor device of claim 1, wherein a floating gate layer is not present in the first gate stack or in the second gate stack.

3. The semiconductor device of claim 1, wherein an aspect ratio of a region between the first spacer and the second spacer is greater than an aspect ratio of a region between spacers of a pair of adjacent memory cell devices in an array of memory cell devices of the semiconductor device.

4. The semiconductor device of claim 1, wherein the test region is one of a plurality of test regions of the semiconductor device, each test region of the plurality of test regions including one or more test memory cell structures.

5. The semiconductor device of claim 4, wherein each test region of the plurality of test regions is arranged at or near a different corner of the semiconductor device.

6. The semiconductor device of claim 1, wherein the test memory cell structure is one of a plurality of test memory cell structures in the test region.

7. The semiconductor device of claim 6, wherein a pitch between the first gate stack and the second gate stack is different from a pitch between a pair of gate stacks included in another test memory cell structure of the plurality of test memory cell structures.

8. The semiconductor device of claim 1, wherein the one or more additional dielectric materials comprise a mask region above the first polysilicon material and a dielectric liner around the mask region and the first polysilicon material.

9. A test structure, comprising:
a substrate including a first raised portion and a second raised portion;
a first gate stack on the first raised portion, wherein the first gate stack comprises a first dielectric material, a first polysilicon material above the first dielectric material, and one or more additional dielectric materials above the first polysilicon material;
a second gate stack on the second raised portion, wherein the second gate stack comprises a second dielectric material, a second polysilicon material above the second dielectric material, and one or more other dielectric materials above the second polysilicon material;
one or more first structures, comprising a first polysilicon structure and a first spacer, on a side of the first raised portion nearest to the second raised portion;
one or more second structures, comprising a second polysilicon structure and a second spacer, on a side of the second raised portion nearest to the first raised portion; and
a dielectric layer over the first gate stack, over the second gate stack, over the one or more first structures, over the one or more second structures, and in a region between the one or more first structures and the one or more second structures,
wherein the dielectric layer, in the region between the one or more first structures and the one or more second structures has a greater height than a region between adjacent spacers of a memory cell device that is associated with the test structure.

10. The test structure of claim 9, wherein the test structure is configured to enable void monitoring for a device that includes the substrate based on a size of an aspect ratio of the region between the one or more first structures and the one or more second structures.

11. The test structure of claim 9, wherein the test structure is in a test region of the substrate, the test region being one of a plurality of test regions of the substrate.

12. The test structure of claim 11, wherein each test region of the plurality of test regions is arranged at or near a different corner of a semiconductor device.

13. The test structure of claim 9, wherein the test structure is one of a plurality of test structures in a test region of the substrate.

14. The test structure of claim 13, wherein a distance between the first gate stack and the second gate stack is different from a distance between a pair of layer stacks included in another test structure of the plurality of test structures in the test region.

15. A semiconductor device, comprising:
a memory cell region; and
a test memory cell region including:
a first gate stack on a first raised portion of a substrate, wherein the first gate stack comprises a first dielectric material, a first polysilicon material above the first dielectric material, and one or more additional dielectric materials above the first polysilicon material,
a second gate stack on a second raised portion of the substrate, wherein the second gate stack comprises a second dielectric material, a second polysilicon material above the second dielectric material, and one or more other dielectric materials above the second polysilicon material,
one or more first structures on a side of the first raised portion nearest to the second raised portion,
wherein the one or more first structures include a first polysilicon structure and a first spacer, and one or more second structures on a side of the second raised portion nearest to the first raised portion,
  wherein the one or more second structures include a second polysilicon structure and a second spacer, and
  wherein a structure including the first gate stack or the second gate stack has a greater height than a memory cell device of the memory cell region, based on:
    the first raised portion or the second raised portion, and
    an absence of a corresponding raised portion in the memory cell region; and
a dielectric layer over at least a portion of the memory cell region and at least a portion of the test memory cell region.

16. The semiconductor device of claim 15, wherein a floating gate layer is not present in the first gate stack or in the second gate stack.

17. The semiconductor device of claim 15, wherein the dielectric layer is over the first gate stack, over the second gate stack, over the one or more first structures, over the one or more second structures, and in a region between the one or more first structures and the one or more second structures.

18. The semiconductor device of claim 15, wherein the test memory cell region is one of a plurality of test memory cell regions of the semiconductor device.

19. The semiconductor device of claim 15, wherein an aspect ratio of a region between the first spacer and the second spacer is greater than an aspect ratio of a region between spacers of adjacent memory cell devices of the memory cell region.

20. The semiconductor device of claim 15, wherein the test memory cell region is configured to enable void monitoring for the semiconductor device based on a size of an aspect ratio of a region between the one or more first structures and the one or more second structures.

* * * * *